US010714531B2

(12) United States Patent
Wei et al.

(10) Patent No.: US 10,714,531 B2
(45) Date of Patent: Jul. 14, 2020

(54) INFRARED DETECTOR DEVICES AND FOCAL PLANE ARRAYS HAVING A TRANSPARENT COMMON GROUND STRUCTURE AND METHODS OF FABRICATING THE SAME

(71) Applicant: L3 Cincinnati Electronics Corporation, Mason, OH (US)

(72) Inventors: Yajun Wei, San Jose, CA (US); Steven Allen, Mason, OH (US); Michael Garter, Lebanon, OH (US); Mark Greiner, Loveland, OH (US); David Forrai, Centerville, OH (US); Darrel Endres, West Chester, OH (US)

(73) Assignee: L3 Cincinnati Electronics Corporation, Mason, OH (US)

( * ) Notice: Subject to any disclaimer, the term of this patent is extended or adjusted under 35 U.S.C. 154(b) by 0 days.

(21) Appl. No.: 15/971,183

(22) Filed: May 4, 2018

(65) Prior Publication Data

US 2018/0294309 A1   Oct. 11, 2018

Related U.S. Application Data

(63) Continuation of application No. PCT/US2017/043734, filed on Jul. 25, 2017.

(60) Provisional application No. 62/513,715, filed on Jun. 1, 2017, provisional application No. 62/366,390, filed on Jul. 25, 2016.

(51) Int. Cl.
*H01L 27/146* (2006.01)
*H01L 27/144* (2006.01)
(Continued)

(52) U.S. Cl.
CPC .... *H01L 27/14694* (2013.01); *H01L 27/1443* (2013.01); *H01L 27/14632* (2013.01);
(Continued)

(58) Field of Classification Search
None
See application file for complete search history.

(56) References Cited

U.S. PATENT DOCUMENTS 6,410,917 B1 * 6/2002 Choi ................. H01L 27/14601
250/338.1
6,803,557 B1   10/2004 Taylor et al.
(Continued)

FOREIGN PATENT DOCUMENTS

EP           2802018 A2    11/2014

OTHER PUBLICATIONS

PCT/US2017/043734 Notification of Transmittal of the International Search Report and the Written Opinion of the International Searching Authority, or the Declaration, dated Oct. 11, 2017.

*Primary Examiner* — Abul Kalam
(74) *Attorney, Agent, or Firm* — Dinsmore & Shohl LLP

(57) ABSTRACT

Focal plane arrays and infrared detector device having a transparent common ground structure and methods of their fabrication are disclosed. In one embodiment, a front-side illuminated infrared detector device includes a contact layer and a detector structure adjacent to the contact layer. The detector structure is capable of absorbing radiation. The front-side illuminated infrared detector device further includes a common ground structure adjacent the detector structure, wherein the common ground structure is transmissive to radiation having a wavelength in a predetermined spectral band, and the common ground structure has a bandgap that is wider than a bandgap of the detector structure. The front-side illuminated infrared detector device further includes an optical layer adjacent the common ground structure.

36 Claims, 27 Drawing Sheets

(51) Int. Cl.
*H01L 31/0304* (2006.01)
*H01L 31/0352* (2006.01)

(52) U.S. Cl.
CPC .. *H01L 27/14649* (2013.01); *H01L 27/14669* (2013.01); *H01L 27/14678* (2013.01); *H01L 31/03046* (2013.01); *H01L 31/035236* (2013.01)

(56) References Cited

U.S. PATENT DOCUMENTS

| | | | |
|---|---|---|---|
| 7,129,104 B2 * | 10/2006 | Gunapala | B82Y 20/00 438/29 |
| 9,515,210 B2 * | 12/2016 | Wei | H01L 31/035236 |
| 10,361,333 B1 * | 7/2019 | Rajavel | H01L 27/14652 |
| 2006/0118722 A1 * | 6/2006 | Pham | H01L 27/1465 250/338.4 |
| 2012/0193608 A1 * | 8/2012 | Forrai | B82Y 20/00 257/14 |
| 2013/0062593 A1 | 3/2013 | Jones et al. | |
| 2014/0312304 A1 * | 10/2014 | Miura | H01L 27/14634 257/21 |
| 2014/0332755 A1 * | 11/2014 | Wei | H01L 31/035236 257/21 |
| 2014/0374701 A1 * | 12/2014 | Wei | H01L 31/03046 257/18 |
| 2015/0243825 A1 | 8/2015 | Keasler et al. | |
| 2015/0295108 A1 * | 10/2015 | Wei | H01L 31/035236 257/21 |

* cited by examiner

INFRARED DETECTOR DEVICES AND FOCAL PLANE ARRAYS HAVING A TRANSPARENT COMMON GROUND STRUCTURE AND METHODS OF FABRICATING THE SAME

CROSS-REFERENCE TO RELATED APPLICATIONS

This application is a continuation of PCT application serial no. PCT/US17/043734 filed on Jul. 25, 2017, which claims the benefit of U.S. Provisional Application No. 62/366,390 filed on Jul. 25, 2016 and U.S. Provisional Application No. 62/513,715 filed on Jun. 1, 2017, the contents of which are incorporated by reference in their entirety.

BACKGROUND

Field

The present specification generally relates to infrared detector devices and, more particularly, to infrared detector devices and focal plane arrays incorporating a transparent common ground structure.

Technical Background

The nBn device structure has been used to improve the operating temperature of photoconductive infrared detectors by blocking the flow of electrons. The nBn device structure generally includes an n-type absorber layer, a barrier layer to block majority carriers, and an n-type contact layer. Such nBn devices can be used to improve the operating temperature of an infrared focal plane arrays (FPA).

For an nBn detector structure, illumination from the thin frontside contact has the advantage for maximizing the quantum efficiency due to proximity of photo generated carriers to the contact. However, in-band photon absorption in the contact layer may lead to certain systematic quantum efficiency loss. Further, the frontside contact layer may not provide enough electrical conductivity to serve as common grounding layer needed for FPA operations.

Accordingly, a need exists for alternative infrared detector device structures that improve quantum efficiency with sufficient grounding.

SUMMARY

Embodiments described herein are directed to wider bandgap contact designs that are transparent to the interested infrared bands, and serve as a focal plane array (FPA) common contact/ground at a same time. In some embodiments, a common ground layer serves as an etch stop structure, thereby allowing full pixel reticulation with minimal erosion into the ground plane. These FPA architectures may be applied to device structures including, but not limited to, nBn, nBP, pBp, xBn, p-i-n, and pn junctions.

In one embodiment, a front-side illuminated infrared detector device includes a contact layer and a detector structure adjacent to the contact layer. The detector structure is capable of absorbing radiation. The front-side illuminated infrared detector device further includes a common ground structure adjacent the detector structure, wherein the common ground structure is transmissive to radiation having a wavelength in a predetermined spectral band, and the common ground structure has a bandgap that is wider than a bandgap of the detector structure. The front-side illuminated infrared detector device further includes an optical layer adjacent the common ground structure.

In another embodiment, a focal plane array includes an array of pixels, each pixel including an infrared detector device further including a contact layer and a detector structure adjacent to the contact layer, wherein the detector structure is capable of absorbing radiation. The focal plane array further includes a common ground structure adjacent the detector structure and an optical layer adjacent the common ground structure. The common ground structure is transmissive to radiation having a wavelength in a predetermined spectral band. The common ground structure has a bandgap that is wider than a bandgap of the detector structure. The contact layer and the detector structure are fully reticulated, and the common ground structure provides a common ground for the array of pixels.

A method of fabricating a frontside-illuminated focal plane array includes providing a wafer having a bulk substrate layer, a contact layer disposed on the bulk substrate layer, a detector structure disposed on the contact layer, and a common ground structure disposed on the detector structure. The common ground structure is transmissive to radiation having a desired wavelength, and the common ground structure has a bandgap that is wider than a bandgap of the detector structure. The method further includes bonding an optical layer to the common ground structure, thinning the bulk substrate layer of the wafer, and etching the contact layer and the detector structure to form an array of infrared photodetector devices. Each individual infrared photodetector device defines a pixel having a wall, wherein the detector structure is fully reticulated and the common ground structure is partially reticulated. The method further includes forming at least one ground pixel by depositing an electrically conductive layer on a wall of at least one pixel to electrically.

These and additional features provided by the embodiments described herein will be more fully understood in view of the following detailed description, in conjunction with the drawings.

BRIEF DESCRIPTION OF DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DESCRIPTION OF EMBODIMENTS

Embodiments of the present disclosure are directed to infrared detector devices and structures having a transparent common ground structure that is transmissive to radiation having a wavelength in a desired spectral band. Such infrared detector devices and structures may be incorporated into infrared applications, such as focal plane arrays (FPA). Embodiments described herein are generically applicable to infrared detector devices regardless of wavelength regime, e.g., short-wave infrared (SWIR), mid-wave infrared (MWIR), long-wave infrared (LWIR), very long-wave infrared (VLWIR), far infrared (FIR), and the like, to improve quantum efficiency.

More specifically, in some embodiments, a common ground structure acts as an etch stop during an etching process that allows for full reticulation of pixels (i.e., individual infrared detector devices) of an FPA device. The common ground structure may take on many different forms. Several non-limiting example common ground structures are described and illustrated herein. In some embodiments, the infrared detector device includes a uni-polar barrier layer between a detector structure and the common ground structure. In some embodiments, the common ground structure includes a wide bandgap common ground plane layer and a carrier collector layer. In yet other embodiments, the common ground structure includes a wide bandgap common ground plane layer and a wide bandgap pass-through conduction layer. Various embodiments of infrared detector devices and FPAs incorporating a common ground structure are described in detail below.

Figure 1:
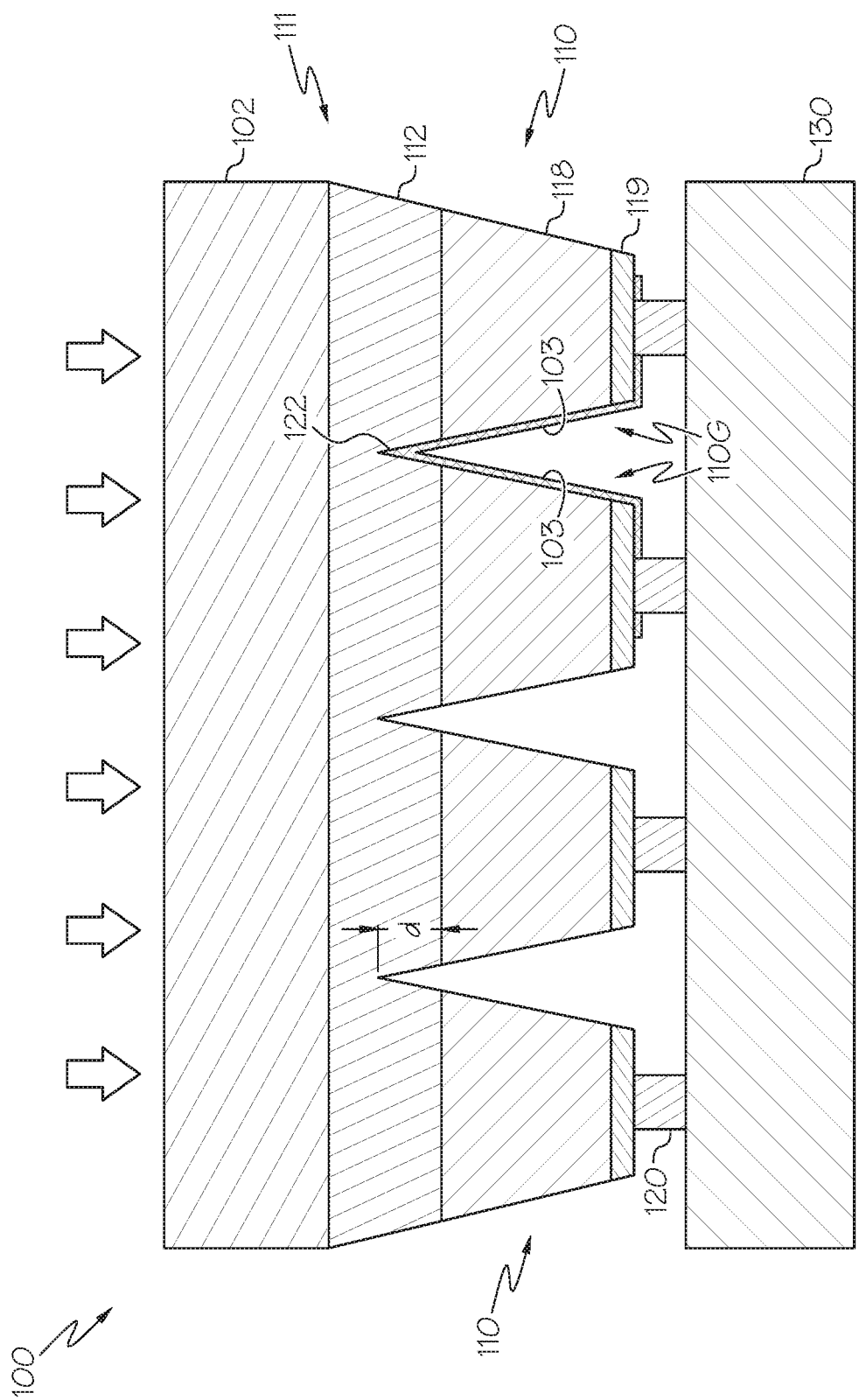
FIG. 1 is a schematic illustration of an example focal plane array (FPA) device having a transparent common ground structure comprising a common ground plane layer according to one or more embodiments described and illustrated herein.

Referring now to FIG. 1, and example FPA device 100 is schematically illustrated. Generally, the FPA device 100 comprises a two-dimensional array of infrared detector devices 110, which are also referred to herein as pixels. Each individual infrared detector device 110 is operable to detect radiation having a wavelength in a predetermined spectral band, such as a spectral band within SWIR, MWIR, LWIR, VLWIR and FIR. The two-dimensional array of infrared detector devices 110 is bonded to a read-out integrated circuit (ROIC) assembly 130, such as by bump bonds 120. As an example and not a limitation, the bump bonds 120 may be indium bump bonds 120. The ROIC assembly 130 may pass or otherwise process signals provided by the two-dimensional array of infrared detector devices 110.

The FPA 100 further includes an optical layer 102 that acts as a window. Radiation enters the FPA 100 through the optical layer 102 as shown by the arrows. The optical layer 102 may include one or more layers of optically transmissive material that provides mechanical strength. As used herein, the terms "transmissive" and "transparent" mean the particular layer(s) absorbs less than or equal to 20% of radiation within a predetermined spectral band, such as less than or equal to 15%, less than or equal to 10%, less than or equal to 5%, less than equal to 2%, or less than or equal to 1%. Accordingly, radiation is able to pass through the optical layer 102 and reach a detector structure 118 for absorption. As a non-limiting example, the optical layer 102 may be fabricated from alternating layers of silicon (or alternatively germanium, gallium arsenide, indium phosphide, or combinations thereof) and optical stack coatings (e.g., anti-reflection coated silicon).

Each infrared detector device 110 includes a contact layer 119, a detector structure 118, and a common ground structure 111. A metal layer (not shown) may be disposed on each contact layer 119 to provide an electrically conductive path from the infrared detector device 110 to the ROIC assembly 130. As described in more detail below, the detector structure 118 may comprise one or more absorber layers configured to absorb radiation having a wavelength in a predetermined spectral band. For example, a first absorber may have a bandgap to detect wavelengths in a first spectral band (i.e., a first "color") and a second absorber layer may have a bandgap to detect wavelengths in a second spectral band (i.e., a second "color").

The material for the contact layer 119 may include a doped n-type semiconductor material. In some embodiments, the contact layer 119 is n-doped InAsSb, InAs/InAsSb SLS, or InAs/Ga(x)In(1−x)Sb SLS. The absorber layer(s) of the detector structure 118 may include an n-doped semiconductor material capable of absorbing photons in a desired spectral band. This absorber layer may be fabricated from materials capable of absorbing wavelengths in any infrared wavelength range, such as near-infrared, SWI, MWIR, LWIR, VLWIR, and FIR. As non-limiting examples, the absorber layer may comprise an n-doped InAs/InAsSb SLS, InAs/Ga(x)In(1−x)Sb SLS, a digital alloy (e.g., InAsSb absorber with GaAs strain balancer), or bulk absorber (e.g., bulk InAsSb).

As shown in FIG. 1, the common ground structure 111 spans across each of the infrared detector devices 110 (i.e., "pixels"), thereby providing a common ground for the array of infrared detector devices 110. Various embodiments of the common ground structure 111 are described herein. The common ground structure 111 should be transmissive to radiation in a predetermined spectral band as well as capable of providing a ground plane for the array of infrared detector device 110. Further, the common ground structure 111 has a wider bandgap than the one or more absorber layers in the detector structure 118 as described in more detail below. The thickness t of the common ground structure 111 is sufficiently large, creating an etching buffer, to allow full isolation of the infrared detector structure in the FPA 100 while maintaining integrity of the common ground structure 111. In the illustrated embodiment, the common ground structure 111 comprises a common ground plane layer 112. Generally, the common ground plane layer 112 may be fabricated from, but not limited to, InAs/InAsSb superlattice, InAs/Ga(x)In(1−x)Sb superlattice, bulk InAs(x)Sb(1−x), bulk GaSb, bulk Ga(x)In(1−x)Sb, etc. where $0=<x<=1$.

The FPA 100 further includes one or more ground pixels 110G that electrically couple the common ground structure 111 to a ground on the ROIC assembly 130, and provides a closed circuit for the individual infrared detector devices 110. The one or more ground pixels 110G may be formed by depositing an electrically conductive layer 122 on one or more pixel sidewalls 103 of the one or more ground pixels 110G that electrically couple the common ground structure 111 to the contact layer 119 and the bump bond 120 associated with the one or more ground pixels 110G. The two-dimensional array of infrared detector devices 110 of the illustrated embodiment are reticulated such that the common ground structure 111 is partially reticulated to a depth d, and the pixel sidewalls 103 of the pixels partially extend into the common ground structure 111. Thus, an ohmic connection is made between the electrically conductive layer 122 and the common ground structure 111.

Figure 2:
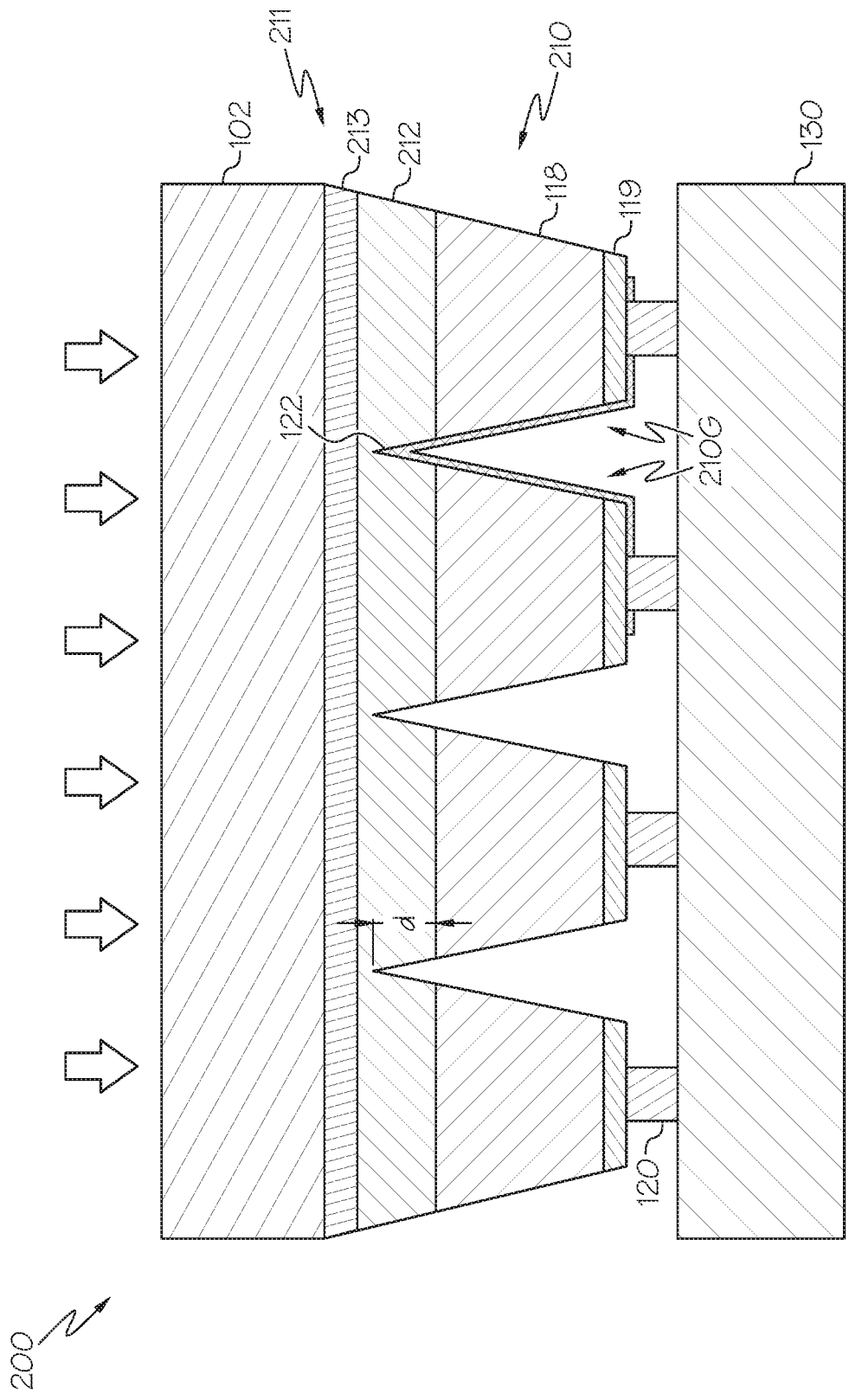
FIG. 2 is a schematic illustration of an FPA device having a transparent common ground structure comprising a common ground plane layer comprising a primary conduction region and an etch buffer region according to one or more embodiments described and illustrated herein.

Referring now to FIG. 2, an example FPA 200 comprising an array of infrared detector devices 210 is schematically illustrated. In the illustrated embodiment, the common ground structure 211 has a doping profile such that a highly doped region is concentrated within the unetched portion of the common ground structure 211. In the example embodiment, the common ground structure 211 is divided into two regions. A first region is an etch buffer region 212 (either low doped or unintentionally doped) that serves as etch buffer that is lightly doped or unintentionally doped and conducts electrical signals through. As used herein, unintentionally doped means that while the material is not intentionally doped, dopants may be unintentionally present within the material due to a variety of reasons, such as native lattice defects. The second region is a primary ground plane conduction region 213 that is highly doped and therefore acts as the primary conduction layer of the common ground structure 211. Such a profile may reduce the impact of etching on the sheet resistance of the ground plane because the primary conduction region 213 is not reticulated, while at a same time limiting free carrier absorptions. Generally, the common ground plane layer 212 and the primary conduction region 213 may be fabricated from, but not limited to, InAs/InAsSb superlattice, InAs/Ga(x)In(1−x)Sb superlattice, bulk InAs(x)Sb(1−x), bulk GaSb, bulk Ga(x)In(1−x)Sb, etc. where $0=<x<=1$.

Figure 3:
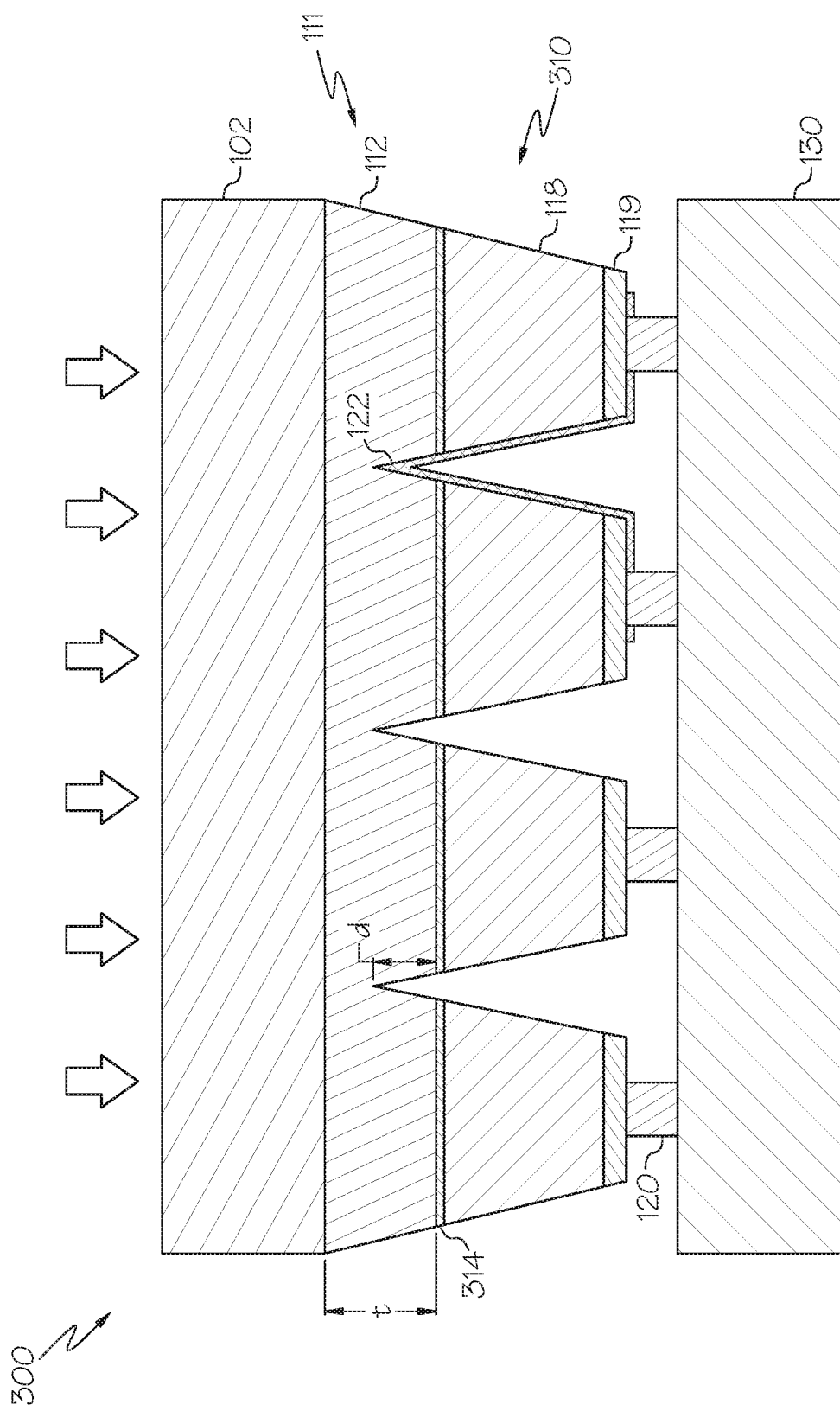
FIG. 3 is a schematic illustration of an FPA device having a uni-polar barrier layer and a transparent common ground structure comprising a common ground plane layer according to one or more embodiments described and illustrated herein.

FIG. 3 schematically illustrates another example FPA 300. In the illustrated example, the infrared detector devices 310 include a uni-polar barrier layer 314 that provides a barrier for either electrons or holes. Thus, the FPA 300 of FIG. 3 is a barrier infrared detector (BIRD) FPA. BIRD FPA devices are described in U.S. Pat. No. 8,846,432, which is hereby incorporated by reference in its entirety. The uni-polar barrier layer 314 may comprise AlAsSb, AlGaAsSb, AlSb/InAs SLS, or AlSb/InAs/GaSb superlattice structure (SLS), etc.

The uni-polar barrier layer 314 is fully reticulated and thus not continuous between individual pixels 310. The example common ground structure 111 comprises a common ground plane layer 112 that has a wider bandgap material than the absorber layer(s) of the detector structure 118. In embodiments, the common ground plane layer 112 is doped to provide low sheet resistance for effective grounding. The sheet resistance should be significantly lower than the FPA pixel impedance at operation bias, such as not to create a significant voltage drop within the ground plane across the entire FPA region. Such voltage drops would lead to bias non-uniformity across the array and are not desirable. As a non-limiting example, the sheet resistance should be no greater than 1% of the expected device impedance at operating bias and temperature. It should be understood that other sheet resistance values may be provided. The exact desirable sheet resistance value depends on the detector cutoff wavelength and intended operating temperature. The longer the cutoff wavelength is, the higher the dark current tends to be. This in turn would require lower ground plane resistance. The example common ground plane layer 112 of FIG. 3, has a thickness t that is within a range of 1 μm to 10 μm, including endpoints, such that it is thick enough to provide enough buffer during pixel reticulation etching to not to fully penetrate the common ground plane layer 112.

As the common ground plane layer 112 has a wider bandgap than the absorber layer(s) within the detector structure 118, the common ground plane layer 112 has negligible absorption for photons with energy less than the bandgap of the common ground plane layer 112.

Figure 4:
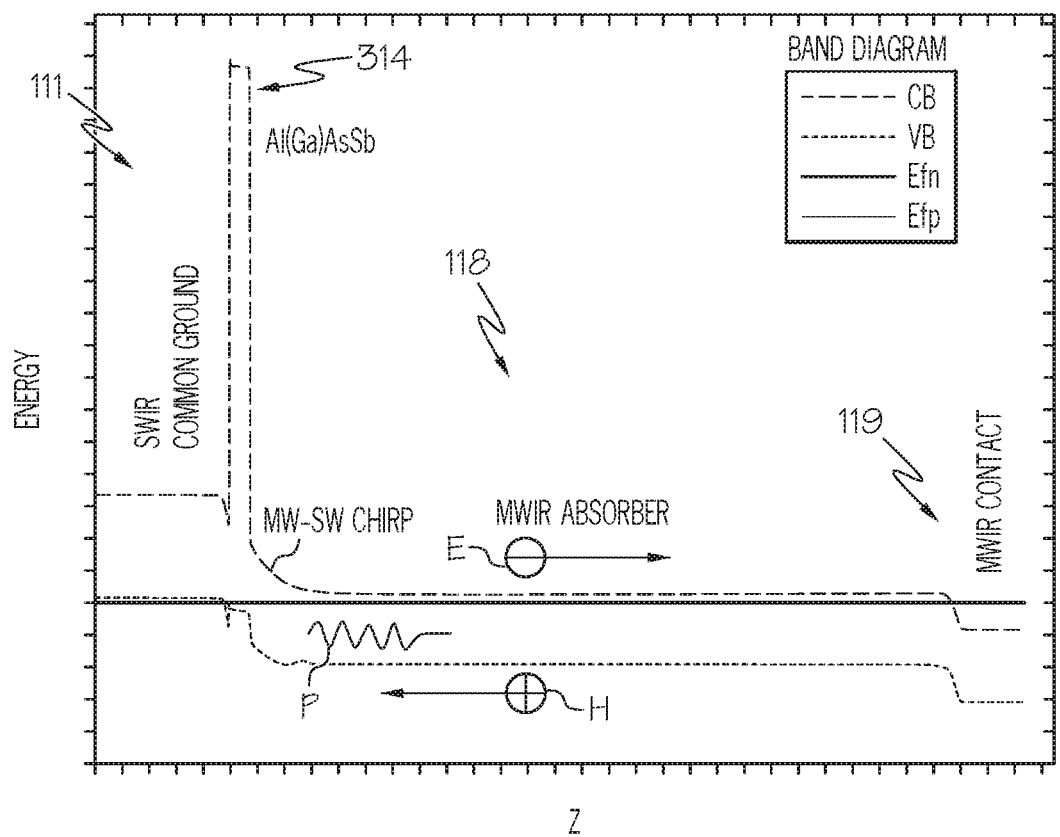
FIG. 4 is a graphic illustration of a simulation result for a band diagram for a mid-wave infrared (MWIR) nBp FPA detector structure as illustrated in FIG. 3, according to one or more embodiments described and illustrated herein.

FIG. 4 graphically illustrates a simulation result for a band diagram for a MWIR) nBp FPA detector structure such as illustrated in FIG. 3. This structure features a p-doped (SWIR) common ground structure 111 on the left side of a uni-polar barrier layer 314, and a short-wave (SW) to mid-wave (MW) chirped region on the right side of the uni-polar barrier layer 314. For a superlattice based absorber, changing the superlattice period can result in a change in the bandgap and valence band offset. The chirped region in this case includes a superlattice with periods continuously changing from one end to the other. The material of the uni-polar barrier layer 314 of the non-limiting example is Al(Ga)AsSb, where (Ga) indicates that Ga % is <10% and can be 0% in embodiments. When an incidence photon P from the left side of the structure is absorbed in the MW absorber region of the detector structure 118, an electron-hole (E-H) pair is generated. The minority hole H propagates past the uni-polar barrier layer 314 to the SWIR common ground structure 111 to get collected. While for the electron E, as it is the majority carrier, only the charge neutrality is required and it does not have to propagate through the device structure to make it to the contact on the right side of the structure. Effectively, one electron E from a metal contact on the right side of the structure flows into the absorber region of the detector structure 118 through an ohmic junction. This keeps the absorber layer charge-neutral, and completes the current flow through the device structure.

Figure 5:
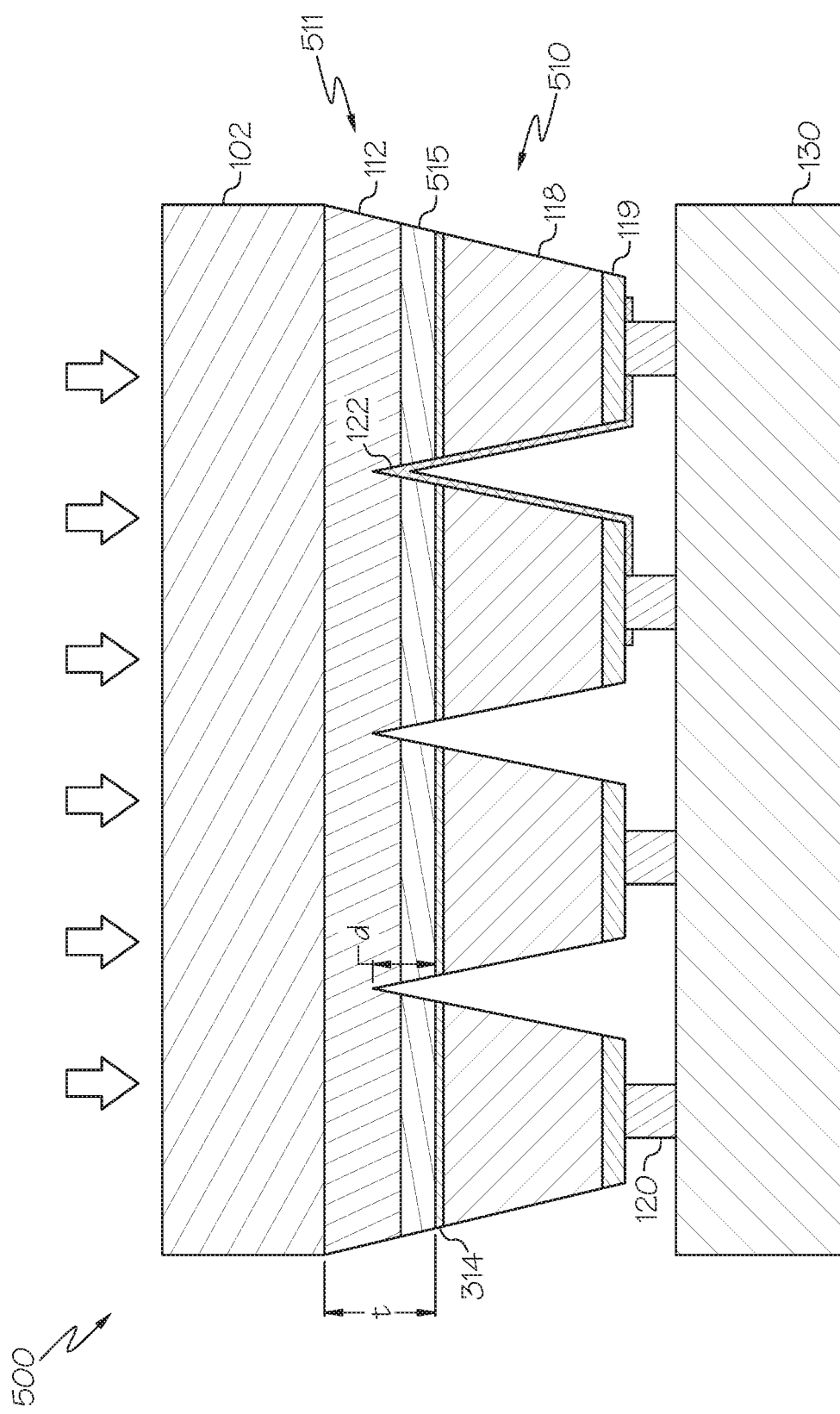
FIGS. 5-7 are schematic illustrations of example FPA devices having a transparent common ground structure comprising a common ground plane layer, a carrier collector layer, and a uni-polar barrier layer according to one or more embodiments described and illustrated herein.
Figure 6:
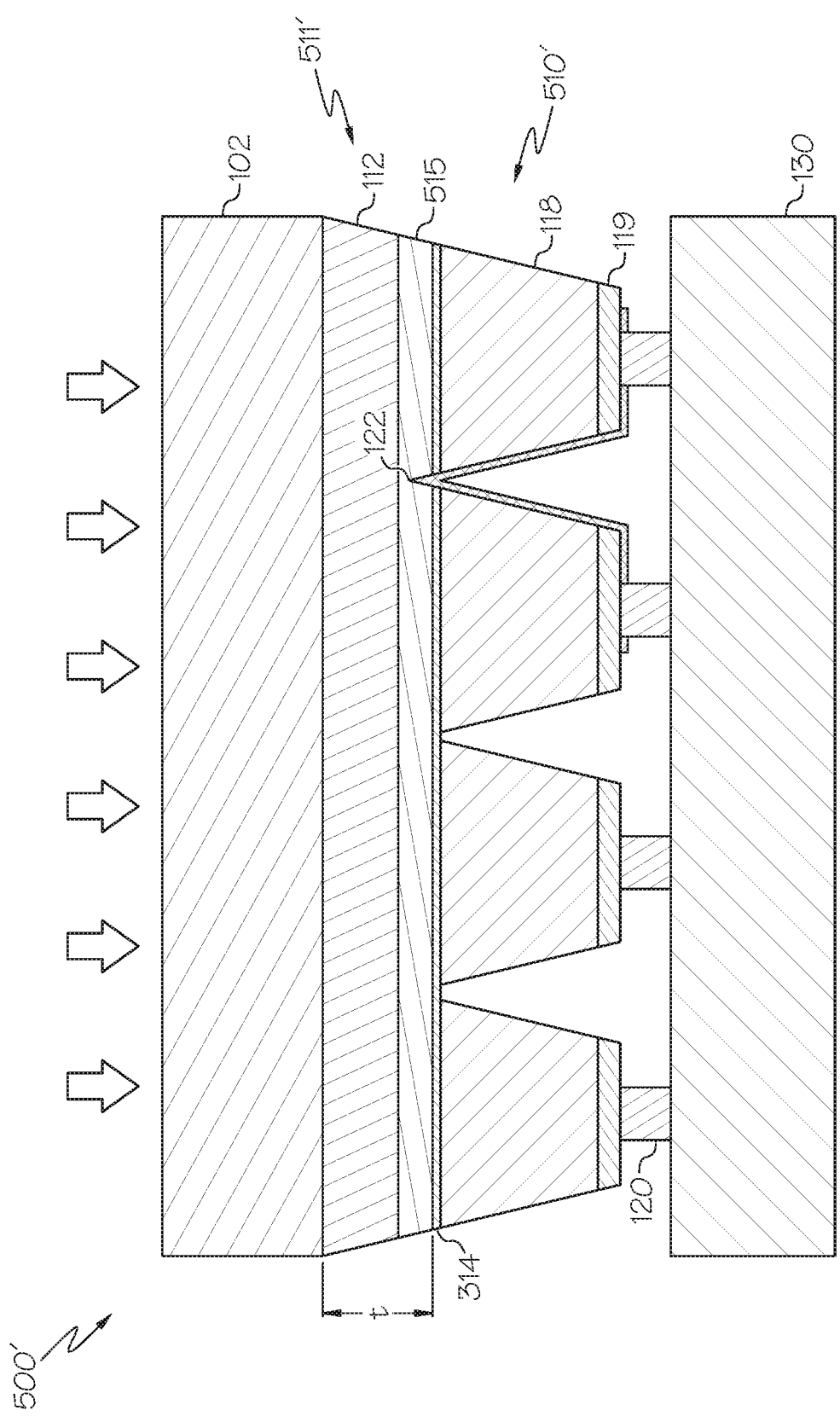
Figure 7:
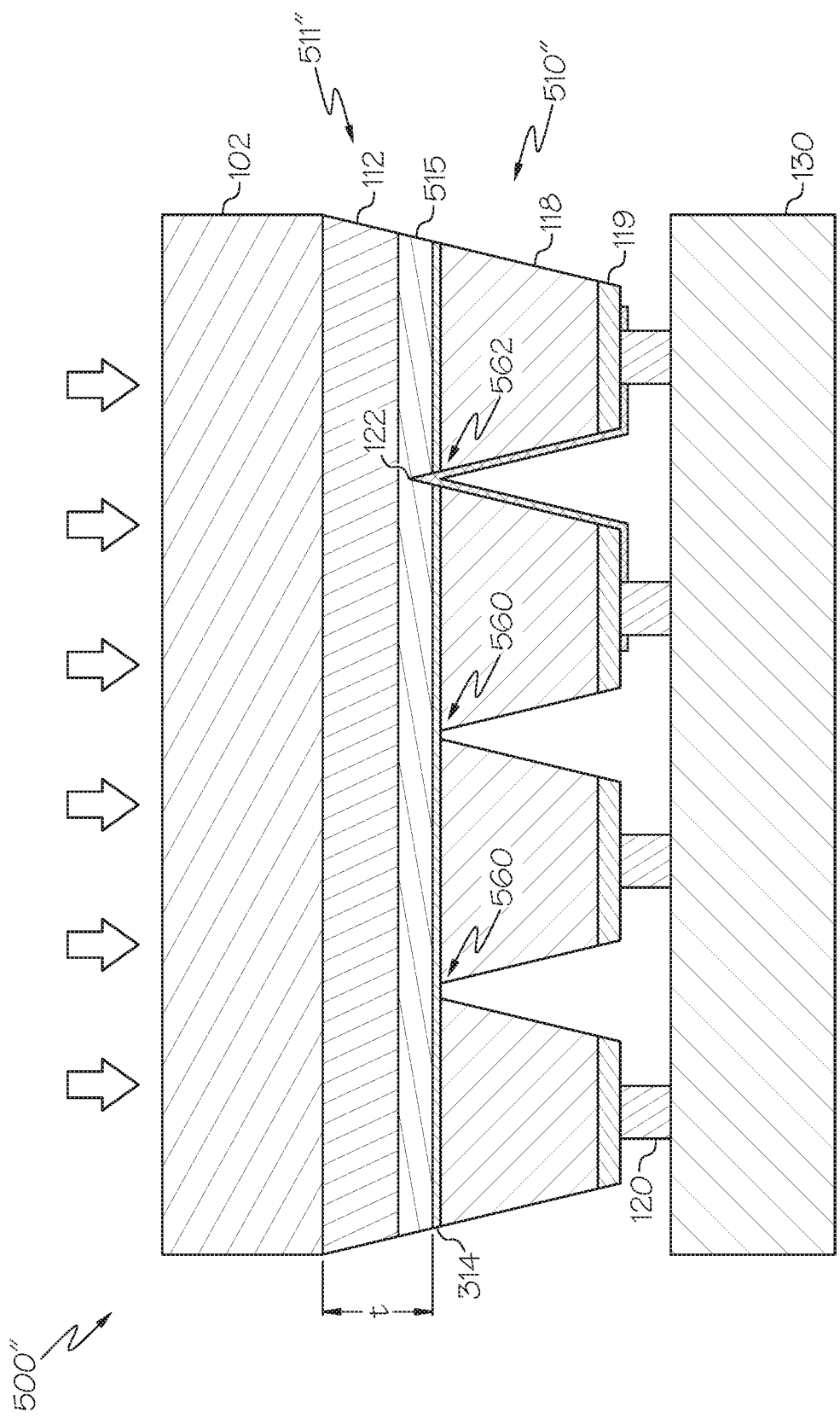

FIGS. 5-7 schematically depict example FPA devices 500, 500', 500" wherein the infrared detector devices 510, 510', 510" (i.e., "pixels") have a common ground structure 511, 511', 511" defined by a common ground plane layer 112 and a carrier collector layer 515. The common ground plane layer 112 is disposed between the optical layer 102 and the carrier collector layer 515. In the illustrated embodiment, each pixel 510 has a uni-polar barrier layer 314 disposed between the detector structure 118 and the carrier collector layer 515. Example materials for the carrier collector layer 515 include, but are not limited to, InAs/InAsSb superlattice, InAs/Ga(x)In(1-x)Sb superlattice, bulk InAs(x)Sb(1-x), etc, as long as the valence band offset is kept close to or higher than that of the absorber and uni-polar barrier layer 314 material. The carrier collector layer 515 is to provide an efficient carrier recombination region. Once minority carriers are propagated across the uni-polar barrier layer 314 and get recombined with an opposite pole carrier in the carrier collector layer 515, that minority carrier is effectively collected.

FIGS. 5-7 show three scenarios of an FPA architecture with the reticulation etch stopping at different depths within the common ground structure. As shown in FIG. 5, the reticulation of the example FPA device 500 stops within the common ground plane layer 112 at a depth d such that the common ground plane layer 112 is partially reticulated. The carrier collector layer 515 and the uni-polar barrier layer 314 are fully reticulated in the illustrated embodiment. In the FPA device 500' depicted in FIG. 6, the reticulation stops at within the carrier collector layer 515 such that the common ground plane layer 112 is not reticulated. In the FPA device 500", only the uni-polar barrier layer 314 and the carrier collector layer of the ground pixels 510G are reticulated as shown at location 562 in FIG. 7. The uni-polar barrier layer 314 and the carrier collector layer 515 are not reticulated at the non-ground pixels (i.e., active pixels), as shown at locations 560 in FIG. 7. As an example and not a limitation, a patterned mask may be used to prevent etchant from reaching the uni-polar barrier layer 314 proximate the active pixels, while allowing etchant to penetrate the uni-polar barrier layer 314 and the carrier collector layer 515 of the ground pixels 510G. In the illustrated embodiment, the ground pixels 510G have a uni-polar barrier layer 314 that is fully reticulated, and a carrier collector layer 515 that is partially reticulated.

It is noted that the three scenarios illustrated by FIGS. 5-7 may occur in a single FPA device at different locations, e.g. a region between the pixels and region at pixel corners. Process capability and detailed material selections may affect the exact final result. However, the reticulation etch should reach the uni-polar barrier layer 314 everywhere throughout the FPA device, and the reticulation etch should penetrate through the uni-polar barrier layer 314 at the ground pixels. It is further noted that minimizing the reticulation depth may minimize the ground plane sheet resistance, and thus the FPA voltage biasing uniformity.

Figure 8A:
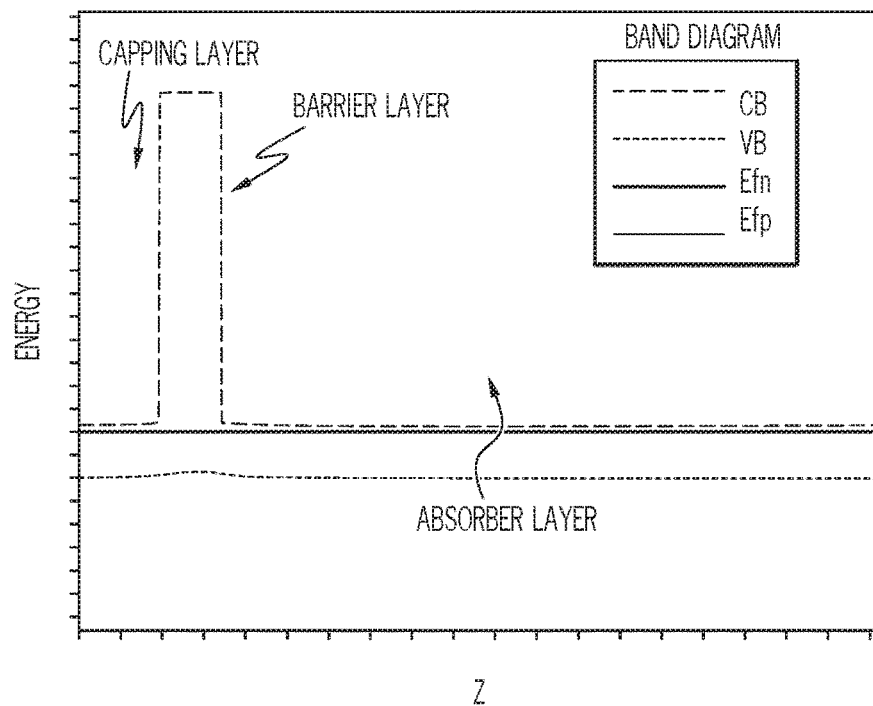
FIGS. 8A-8C are graphic illustrations of a band diagram illustrating the fundamental carrier collection mechanism in an nBn device structure.
Figure 8B:
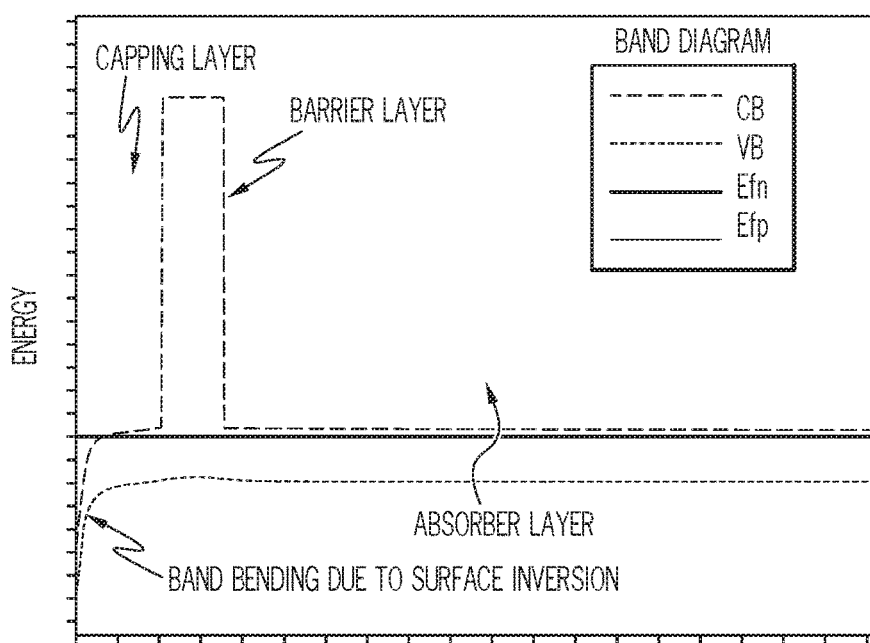
Figure 8C:
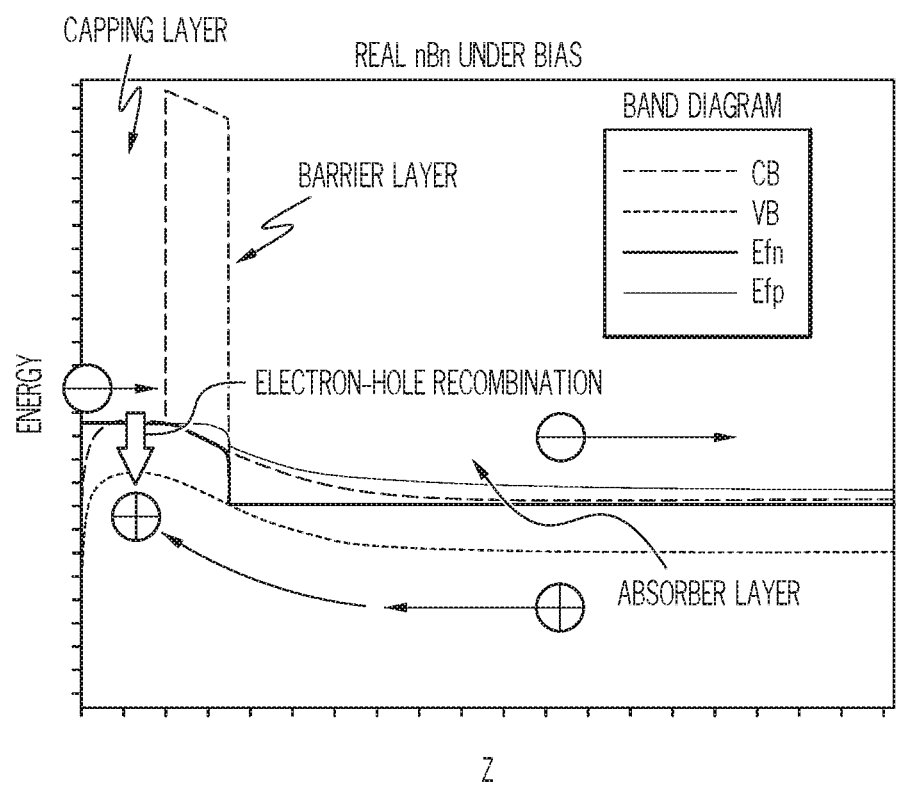

FIGS. 8A-8C graphically illustrate band diagrams showing the carrier collection mechanism of a typical nBn device. As shown in FIG. 8A, for a theoretical ideal nBn device, the capping layer (i.e., the layer of the nBn device on the left side of the barrier layer) has the valence band line up with the rest of the device structure. FIG. 8B shows a real nBn device under zero bias. It is noted that any termination on the capping layer can be highly n-type, such as bulk InAsSb material, leading to severe band bending, as shown in FIG. 8B. When a material is highly n-doped, the Fermi energy level will reside deep within the conduction band. As Fermi energy of a device structure remains the same everywhere within, both valance band edge and conduction band edge effectively get pushed downwards. As this highly doped region only resides in the vicinity of the surface, band bending only happens near the surface. Assuming an n-type absorber layer in the detector structure to the right of the barrier layer, holes within the absorber are the minority carriers that need to be collected at the capping layer. However, with the amount of band bending under zero bias as shown in FIG. 8B, most minority holes would not be able to propagate through the structure to be collected by the metallization layer(s) (i.e., metal contact layer(s)) on top of the capping layer. The metallization layer(s) are used to interface a device structure to external circuitry with metal contacts. Signals are not known until external circuitry picks them up and converts them into a more accessible format, such as an image, or a voltage or current large enough to be read by an instrument. Under certain bias, as illustrated in FIG. 8C, the band bending of the entire nBn structure forms a potential well for the minority holes to get accumulated at the capping layer. Now, the accumulated holes will have limited lifetime in the capping layer. The holes would recombine with electrons in the capping layer. It is noted that n+ InAs(Sb) at the surface would make suitable Ohmic contact with metallization layers for electrons (not for holes). This recombination enables the signal current to flow through the entire device structure. Thus, it is this carrier recombination that makes the capping layer an effective carrier collector.

Additionally, as the accumulated carriers get recombined, there will be a certain percentage of radiative recombination. Some of this recombination will become reabsorbed in the absorber layer, especially when the contact layer has a wider bandgap than the absorber layer, thereby leading to secondary absorption and enhancing the device quantum efficiency (QE). This process will continue and generate further generations of absorptions. This process is referred herein as the photon recycling effect in an nBn device structure. When a superlattice structure (SLS) absorber material is utilized in the absorber layer, it may help to enhance the device QE. On the other hand, as the different generations of absorption events are correlated, a certain level of reduction of device electronic noise is expected as well.

Figure 9:
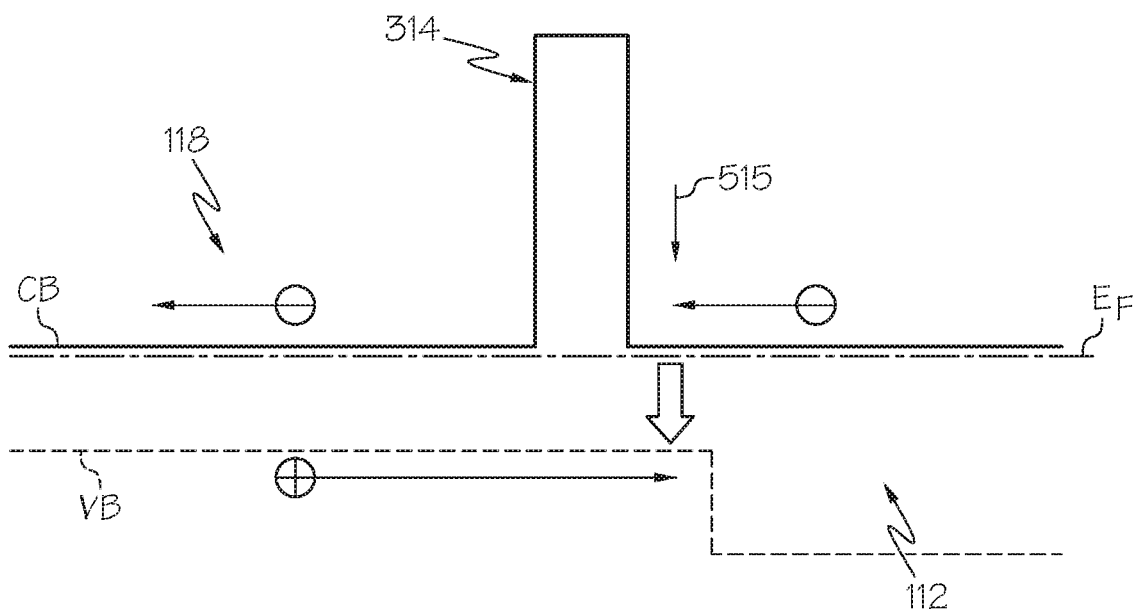
FIG. 9 is a graphic illustration of a band diagram of an infrared detector device having a carrier collector layer being fabricated from a material with a same bandgap and band alignment as an absorber layer according to one or more embodiments described and illustrated herein.
Figure 10:
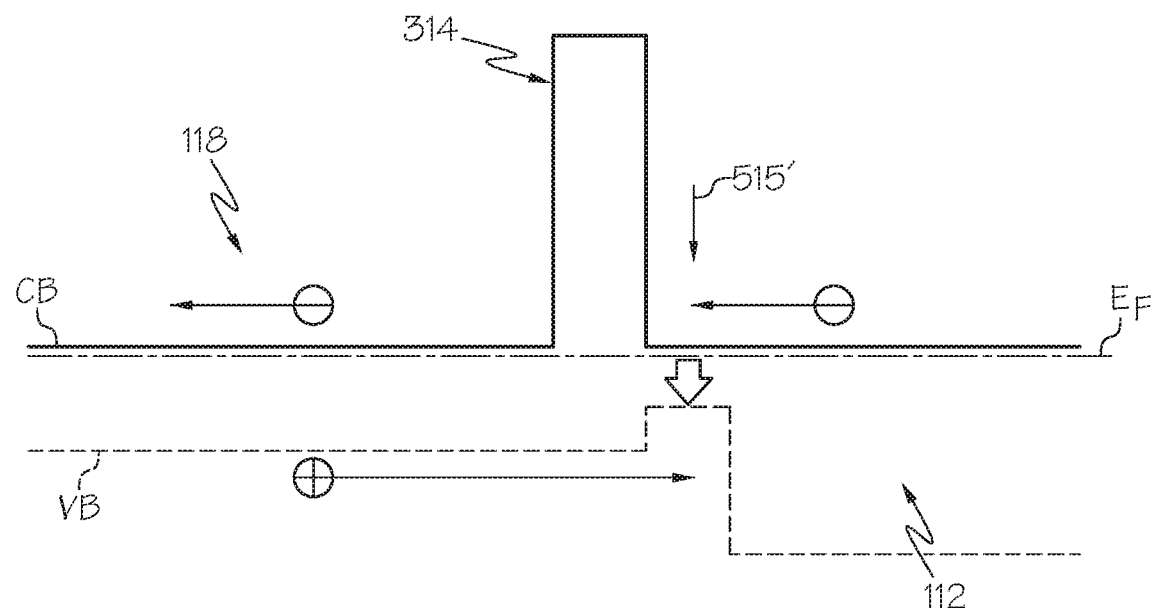
FIG. 10 is a graphic illustration of a band diagram of an infrared detector device having a carrier collector layer being fabricated from a material with a bandgap that is lower than that of the bandgap material of the absorber layer according to one or more embodiments described and illustrated herein.

With the above description of the carrier collection mechanism with reference to FIGS. 8A-8C, FIGS. 9 and 10 illustrate two example schemes of a transparent contact with two different configurations of the carrier collector layer 515 (see also FIGS. 5-7). FIG. 9 depicts a band diagram of a scheme with the carrier collector layer 515 being fabricated from a material with a same bandgap and band alignment as the absorber layer. FIG. 10 depicts a scheme with the carrier collector layer 515' being fabricated from a material with a bandgap that is lower than that of the bandgap material of the absorber layer 112. This scheme depicted in FIG. 10 allows carrier accumulation even at zero bias. In addition, the lower bandgap material tends to have shorter carrier lifetime, further enhancing the recombination efficiency and thus carrier recombination efficiency, thereby leading to potentially higher device QE under a same bias compared with scheme depicted in FIG. 10.

Figure 11:
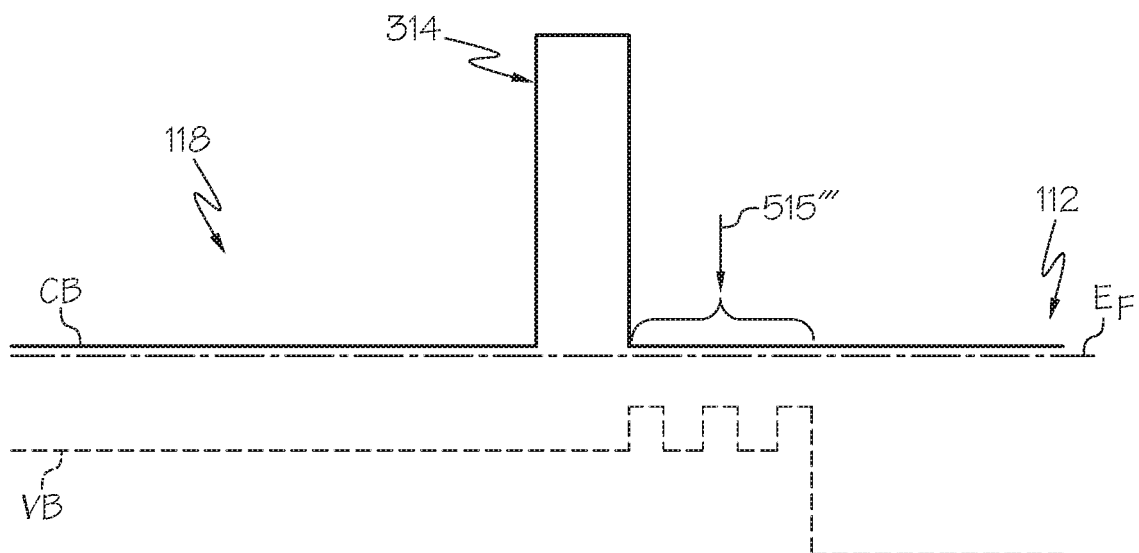
FIG. 11 is a graphic illustration of a band diagram of an infrared detector device having a carrier collector layer having alternating layers of a wider bandgap material and a narrower bandgap material according to one or more embodiments described and illustrated herein.

FIG. 11 schematically illustrates yet another example configuration of a carrier collector layer 515'''. The example carrier collector layer 515''' has alternating layers of a wider bandgap material and a narrower bandgap material such that a bandgap of the carrier collector layer has a corrugated shape. The wider bandgap material has a bandgap that is wider than the narrower bandgap material.

Figure 12:
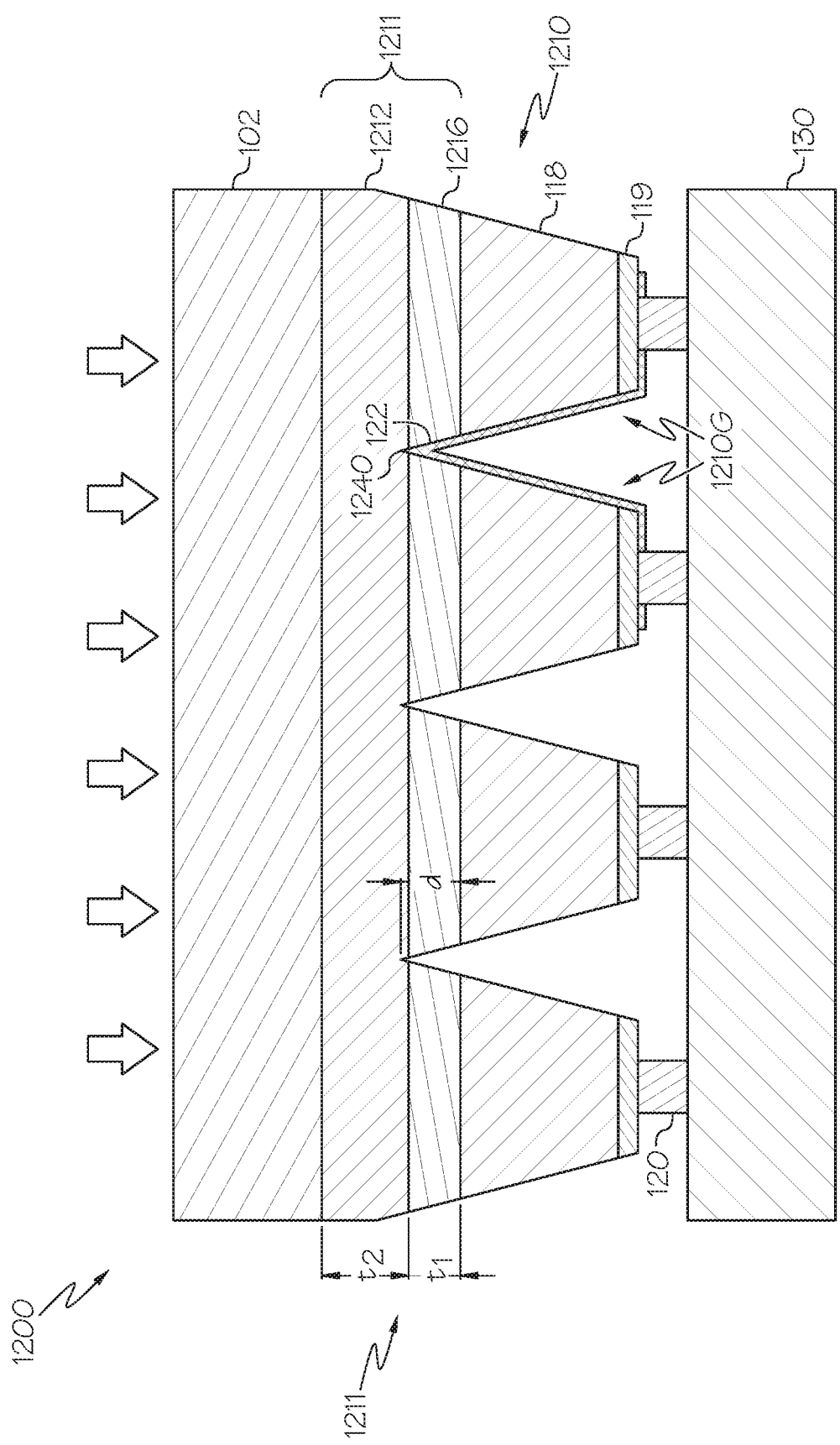
FIG. 12 is a schematic illustration of an example FPA device having a transparent common ground structure comprising a pass-through conduction layer and a common ground plane layer according to one or more embodiments described and illustrated herein.

Another example FPA device 1200 is schematically illustrated in FIG. 12. In the illustrated embodiment, a common ground structure 1211 comprises a wider bandgap pass-through conduction layer 1216 on the detector structure 118, and a wide bandgap common ground plane layer 1212 (i.e., wider than the bandgap of the absorber layer(s) of the detector structure 118. The common ground plane layer 1212 has a thickness $t_2$. The pass-through conduction layer 1216 has a thickness of $t_1$, where $t_2 > t_1$. Pixel reticulation penetrates through the pass-through conduction layer 1216 and stops within the common ground plane layer 1212. Thus, the pass-through conduction layer 1216 is fully reticulated and the common ground plane layer 1212 is only partially reticulated. The pass-through conduction layer 1216 may include, but is not limited to, Ga(x)In(1−x)As(y)Sb(1−y) bulk material, (0=<x<=1, 0=<y<=1), InAs/Ga(x)In(1−x)Sb superlattice, etc. The wide bandgap common ground plane layer 1212 may serve as an etch stop layer during the pixel reticulation process.

Usually, it is more difficult to form an ohmic contact to a wide bandgap material. The material of the pass-through conduction layer 1216 has a significantly smaller bandgap than the bandgap of the material of the common ground plane layer 1212, but its bandgap is still significantly larger than the absorber layer(s) of the detector structure 118, thereby allowing in-band optical photons to pass through with little absorption. Additionally, this allows formation of effective ohmic contact to the electrically conductive layer 122 on the sidewall surface of the ground pixels 1210G, while pass-through electrical conduction to the common ground plane layer 1212 with a grown-in high quality semiconductor junction. At a same time, for active pixels 1210, the pass-through conduction layer 1216 will not impede the flow of signal current generated in the detector structure 118. The pass-through conduction layer 1216 may not have effective etching selectivity against the material used for the detector structure. Thus, both the pass-through conduction layer 1216 and the wide band gap ground plane layer 1212 are desired.

Figure 13:
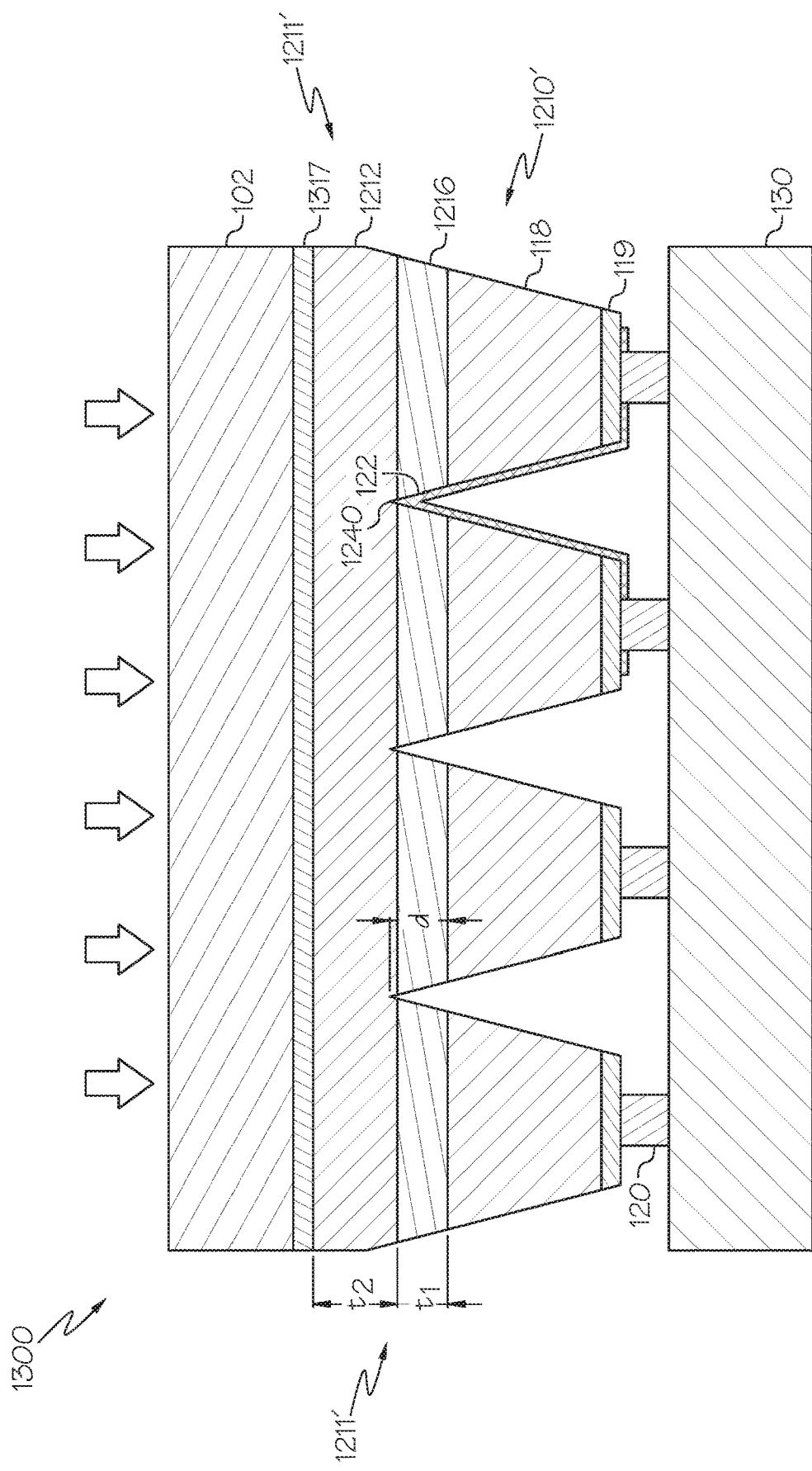
FIG. 13 is a schematic illustration of an example FPA device having an oxidation prevention layer and a transparent common ground structure comprising a pass-through conduction layer and a common ground plane layer according to one or more embodiments described and illustrated herein.

In a non-limiting scenario, the wide bandgap common ground plane layer 1212 contains a significant percentage of aluminum elements (over 90% aluminum as a non-limiting example) that is subject to oxidization in ambient air, and may lead to ground plane resistivity increase during wafer storage and transportation under ambient air conditions or another oxidizing gas (e.g. oxygen) containing atmosphere. To reduce this oxidation effect, an oxidation prevention layer 1317 that is substantially aluminum-free may be grown on top of the wide bandgap common ground plane layer, as illustrated in the common ground structure 1211' of the example FPA device 1300 depicted in FIG. 13. This oxidation prevention layer 1317 should have negligible in-band optical absorption, and may also further assist in reducing the ground plane resistivity of the infrared detector devices 1210'. It is noted that the oxidation prevention layer 1317 may be implemented in any of the embodiments described herein.

Figure 14:
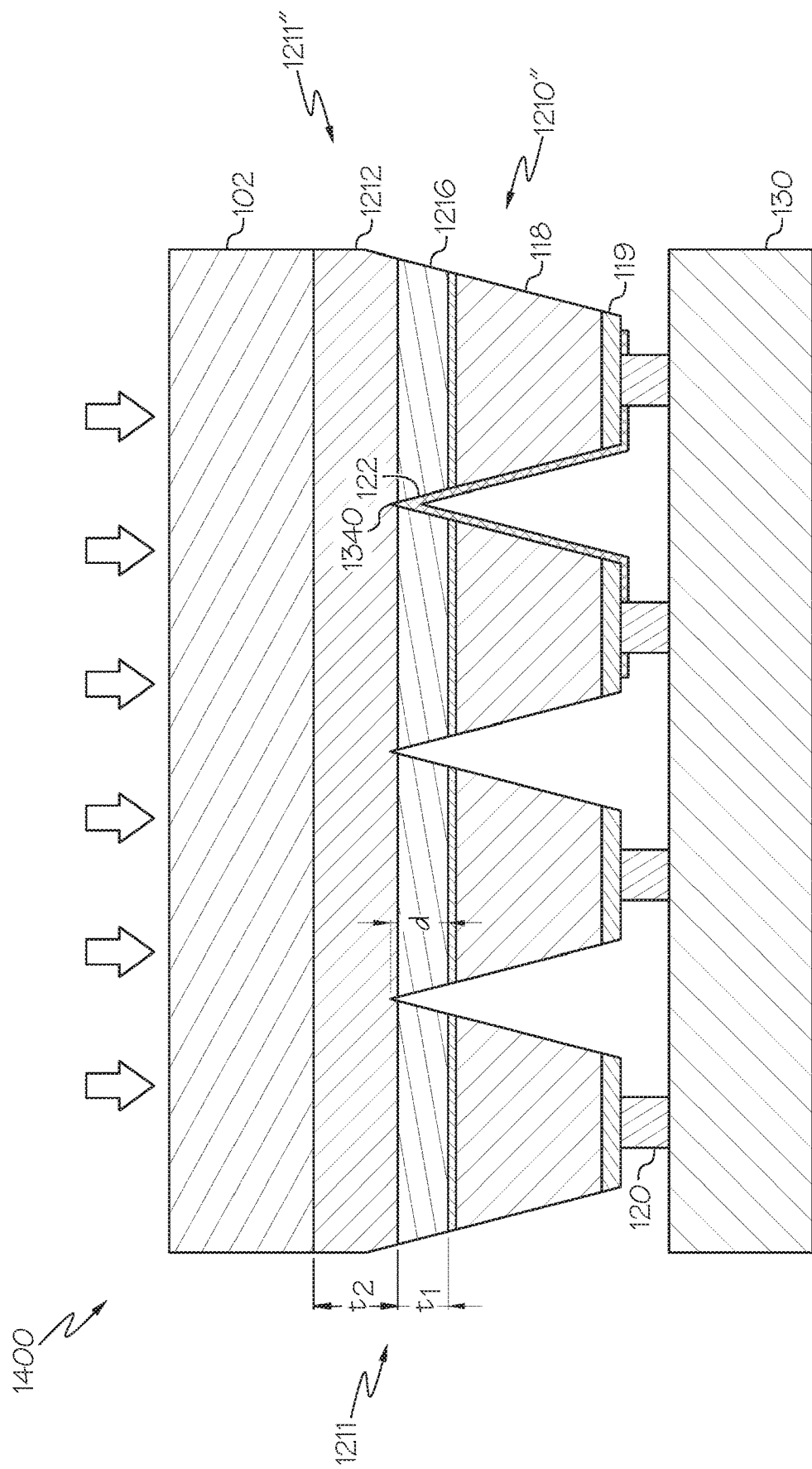
FIG. 14 is a schematic illustration of an example FPA device having a uni-polar barrier layer and a transparent common ground structure comprising a pass-through conduction layer and a common ground plane layer according to one or more embodiments described and illustrated herein.
Figure 15:
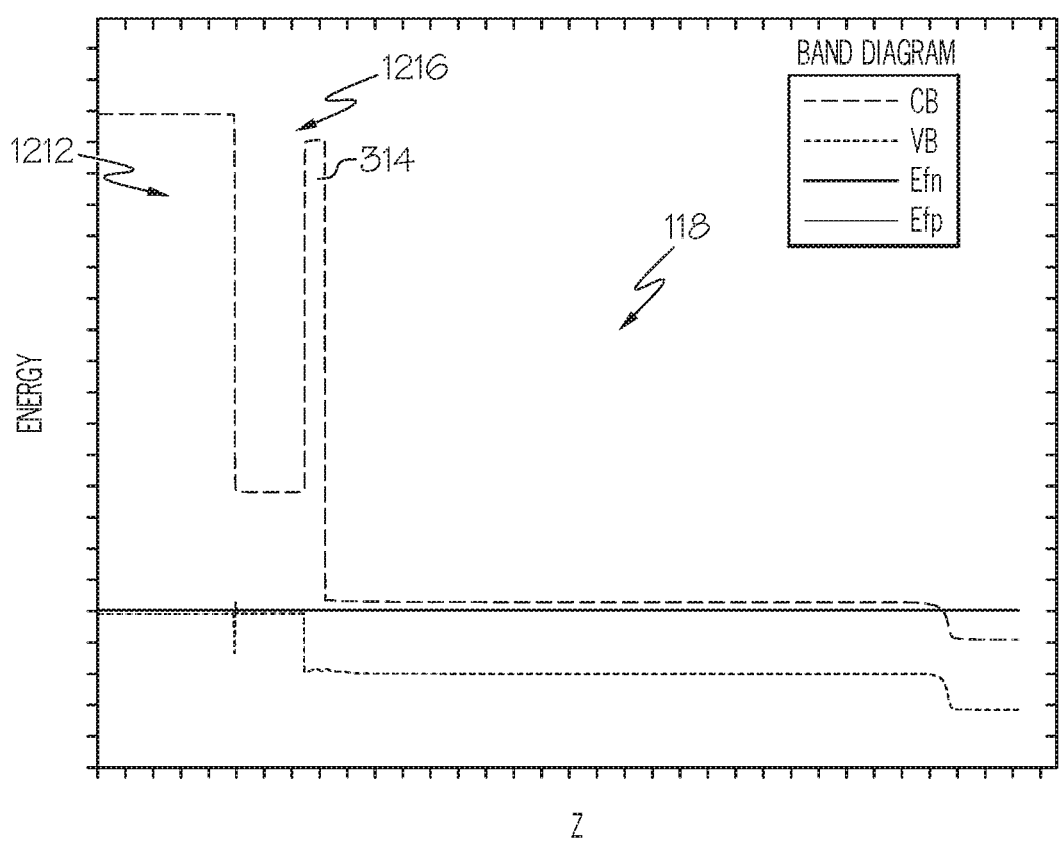
FIG. 15 is a graphic illustration of a band diagram of a simulated device structure as depicted in FIG. 14, according to one or more embodiments described and illustrated herein.

In another example FPA device 1400 depicted in FIG. 14, a uni-polar barrier layer 314 is disposed between the detector structure 118 and the pass-through conduction layer 1216 of the common ground structure 1211'' of the infrared devices 1210''. FIG. 15 is an example band diagram of a simulated device structure as depicted in FIG. 14. The material of the absorber layer of the detector structure 118 is n-type, a uni-polar barrier layer 314 (electron barrier) is made of an AlGaAsSb alloy material. The wider bandgap pass-through conduction layer 1216 is p-doped and made of a GaInAsSb alloy, or an InAs/Ga(x)In(1−x)Sb SLS. The wide bandgap common ground plane layer 1212 is p-doped and made of an AlGaAsSb alloy material.

Figure 16:
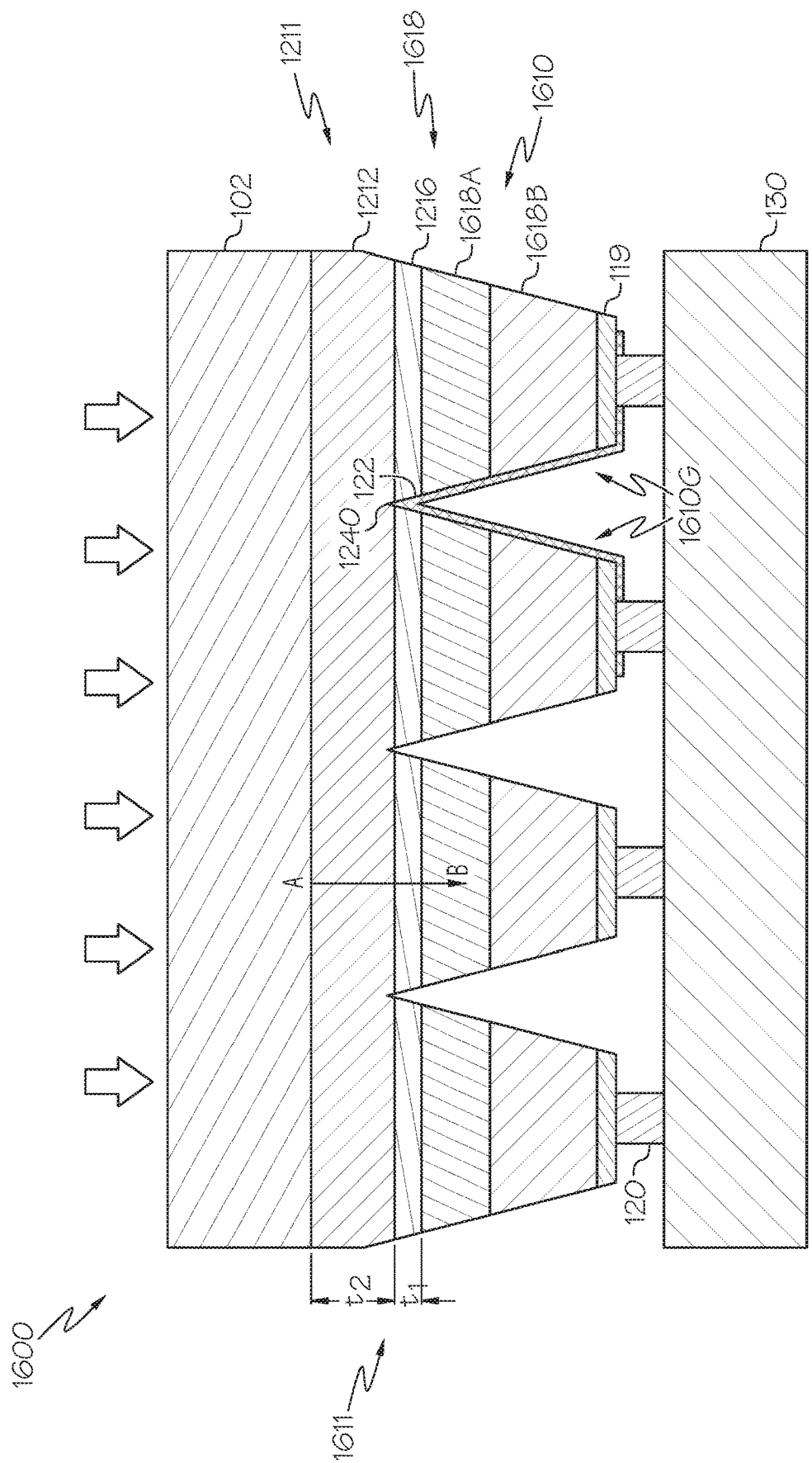
FIG. 16 is a schematic illustration of an example dual-band FPA device having a transparent common ground structure comprising a pass-through conduction layer and a common ground plane layer according to one or more embodiments described and illustrated herein.

A dual-band FPA device 1600 is schematically illustrated in FIG. 16. Particularly, FIG. 16 illustrates an implementation of the transparent conducting etch stop layer structure for a dual band device structure. The detector structure 1618 of the infrared detector device 1610' has a first absorber layer 1618A having a first bandgap (e.g., "color 1") and a second absorber layer 1618B having a second bandgap ("color 2"). Thus, the dual-band FPA device 1600 is capable of detecting two different spectral bands depending on the applied bias.

In the illustrated embodiment, a pass-through conduction layer 1216 and a common ground plane layer 1212 has a bandgap that is wider than the material used to detect color 1 and color 2. The pass-through conduction layer 1216 enables effective ohmic contact to the electrically conductive layer 122 on the sidewall surface of the ground pixels 1610G. The common ground plane layer 1212 provides etching selectivity against the material used for the detector structure.

Figure 17:
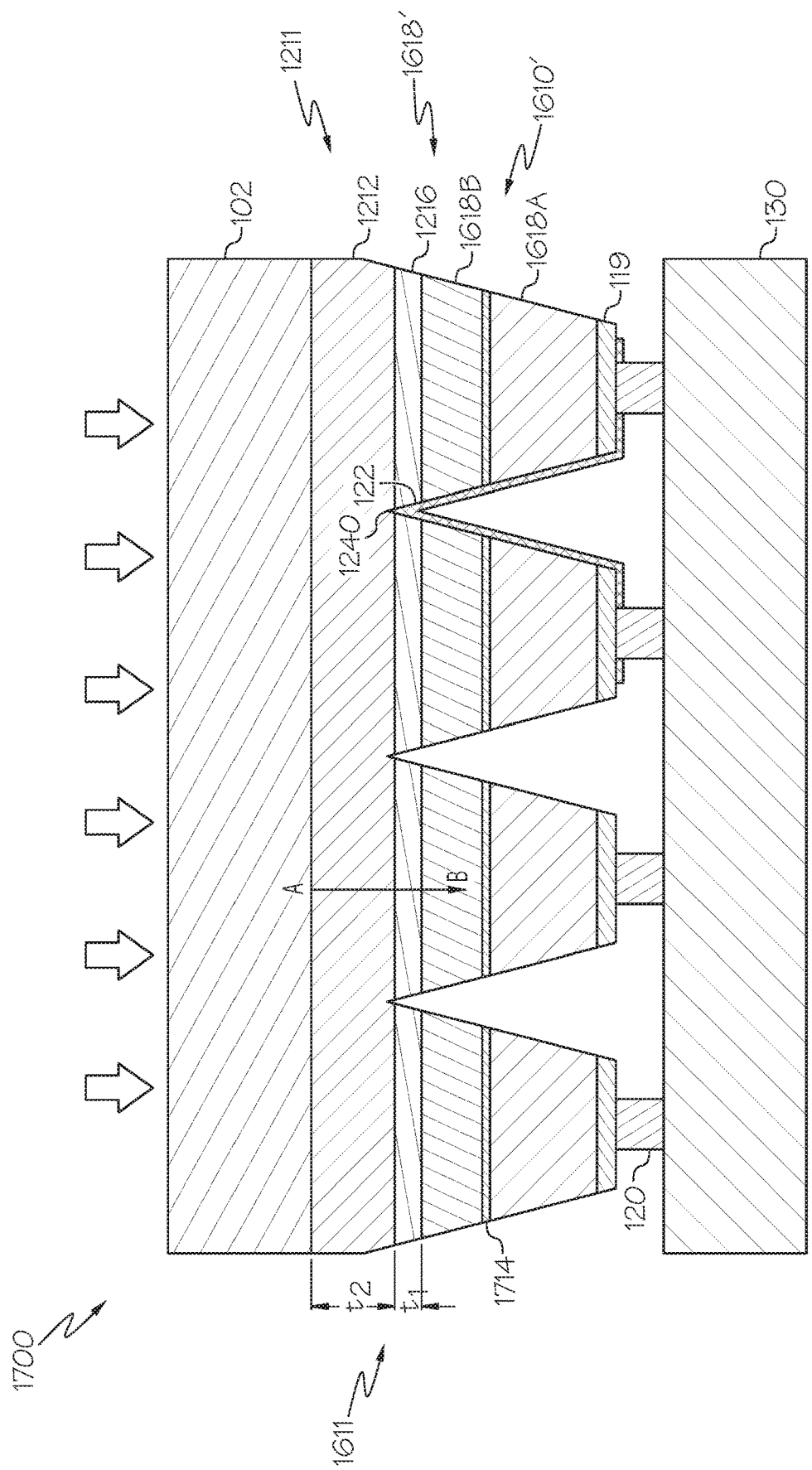
FIG. 17 is a schematic illustration of an example dual-band FPA device having a uni-polar barrier layer between two absorber layers and a transparent common ground structure comprising a pass-through conduction layer and a common ground plane layer according to one or more embodiments described and illustrated herein.
Figure 18A:
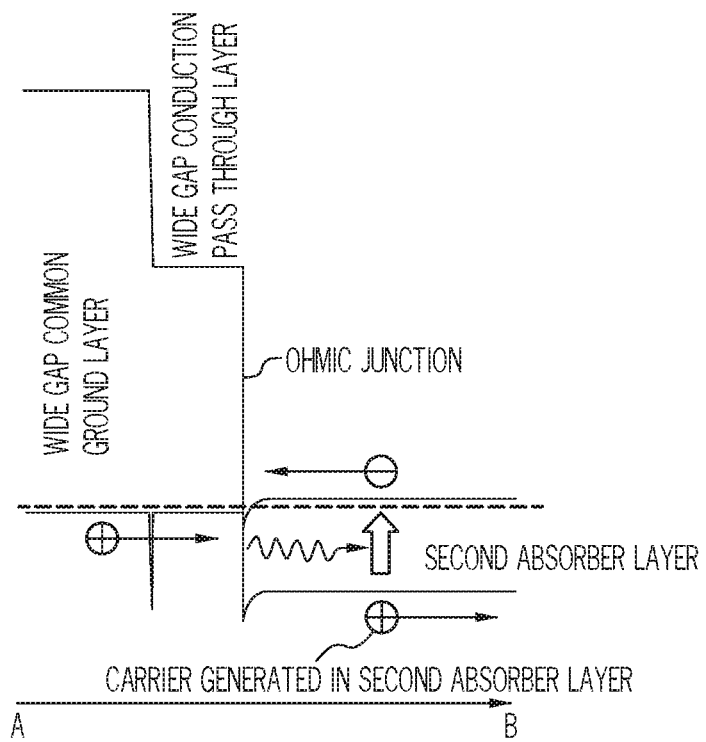
FIGS. 18A and 18B are graphic illustrations of band alignment diagrams of the dual-band FPA device depicted in FIG. 17 under different biases according to one or more embodiments described and illustrated herein.
Figure 18B:
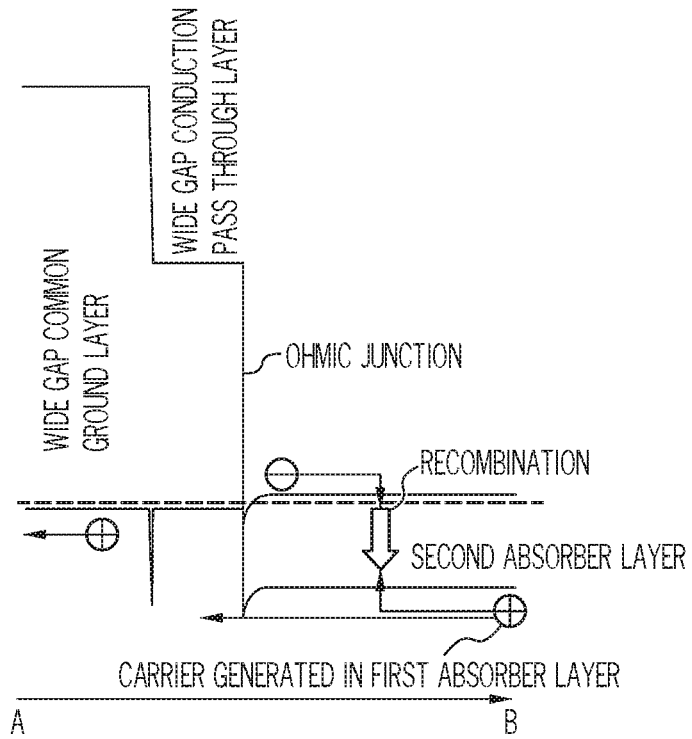
Figure 19:
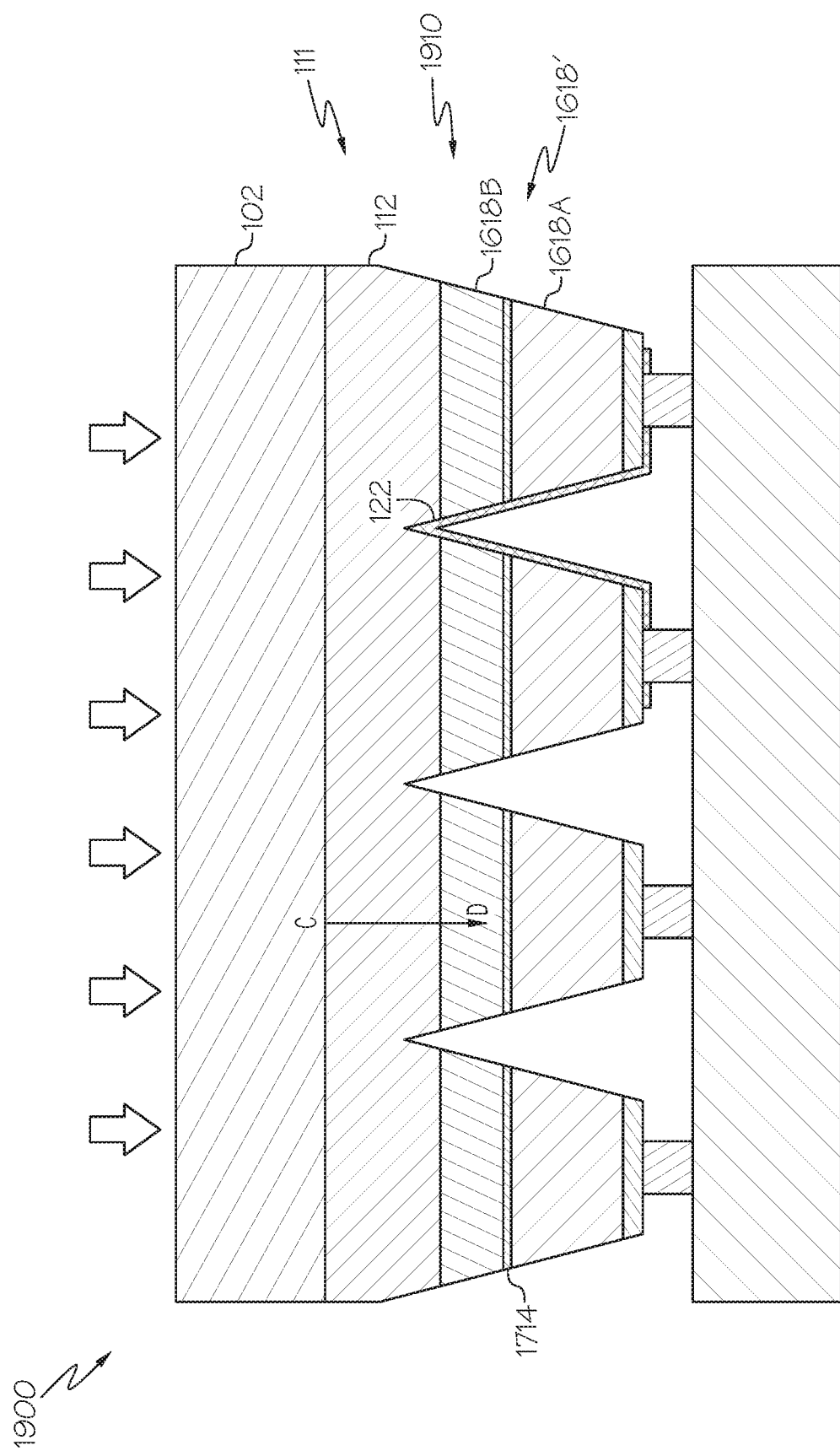
FIG. 19 is a schematic illustration of an example dual-band FPA device having a uni-polar barrier layer between two absorber layers and a transparent common ground structure comprising a common ground plane layer according to one or more embodiments described and illustrated herein.

FIGS. 17-20 illustrate example embodiments of a dual-band FPA device incorporating a uni-polar barrier layer within the detector structure. FIG. 17 schematically illustrates a dual-band FPA device 1700 having a pass-through conduction layer 1216 that incorporates a uni-polar barrier layer 1714 between the first absorber layer 1618A and the second absorber layer 1618B within the detector structure 1618' of the infrared detector devices 1610. A band alignment diagram along line A-B of FIG. 17 is graphically illustrated in FIGS. 18A and 18B. FIG. 19 schematically illustrates an example dual-band FPA device 1900 having no pass-through conduction layer and only a common ground plane layer 112 for the common ground structure 111, and a uni-polar barrier layer 1714 between the first absorber layer 1618A and the second absorber layer 1618B within the detector structure 1618' of the infrared detector devices 1910. A band alignment diagram along line C-D of FIG. 19 is graphically illustrated in FIGS. 20A and 20B.

The material of both the first absorber layer 1618A and the second absorber layer 1618B of the dual-band FPA devised depicted in FIGS. 17 and 19 are n-type, and the uni-polar barrier layer 1714 is a uni-polar electron barrier. Both the pass-through conduction layer 1216 and the common ground plane layers 1212, 112 of FIGS. 17 and 19 are doped p-type. The pass-through conduction layer 1216 is made of a GaInAsSb alloy or an InAs/Ga(x)In(1−x)Sb SLS material. The common ground plane layers 1212, 112 are made of an AlGaAsSb alloy.

Figure 20A:
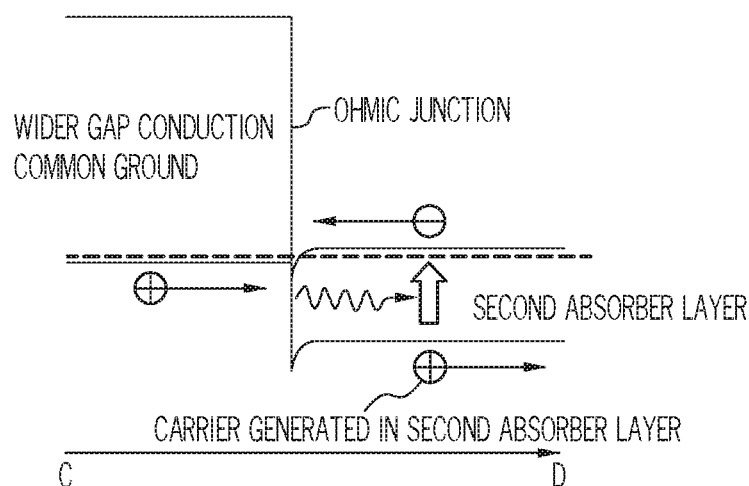
FIGS. 20A and 20B are graphic illustrations of band alignment diagrams of the dual-band FPA device depicted in FIG. 19 under different biases according to one or more embodiments described and illustrated herein.

Under bias direction for color 2 operation, as shown in FIGS. 18A and 20A, an electron-hole pair is generated in the second absorber layer 1618B. The minority carrier hole propagates to the other side of the device structure towards the bonding bumps 120 for collection. There will be a majority hole present within the pass-through conduction layer 1216 or the common ground plane layer 112 that recombines with a majority electron at the interface between the pass-through conduction layer 1216 or common ground plane layer 112 and the second absorber layer 1618B. This interface has a type II misaligned bandgap and the junction is ohmic, enabling the current flow through the junction.

Figure 20B:
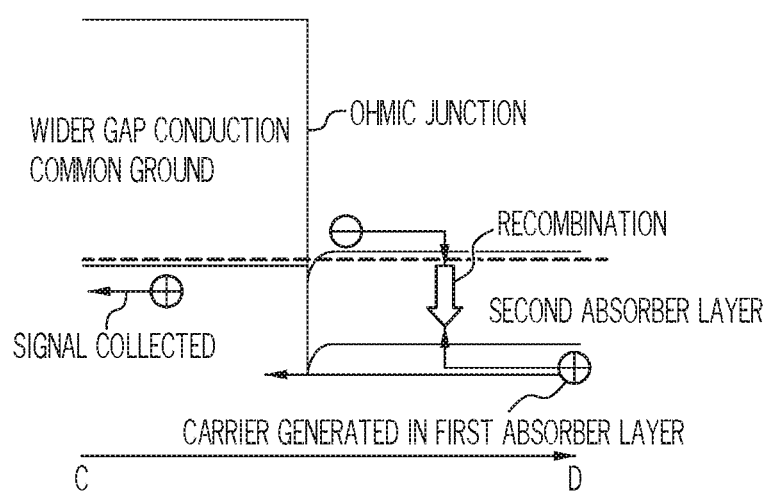

Under bias direction for operation of color 1, as shown in FIGS. 18B and 20B, the minority hole carrier generated from the first absorber layer 1618A is transported into the second absorber layer 1618B where it will recombine with a majority electron in the second absorber layer 1618B. For charge neutrality, a hole within the pass-through conduction layer 1216 or the ground plane 112 will flow toward ground metallization, as if the original minority hole carrier from the first absorber layer 1618A has propagated through the entire device structure and get collected at the ground metallization.

Various embodiments of fabricating an FPA device having a transparent common ground structure will now be described in detail. It is noted that FIGS. 21A-29 illustrate an example process to fabricate an FPA device having a common ground structure including a common ground plane layer (e.g., an FPA device 100 as shown in FIG. 1), and FIGS. 30-34 illustrate an example process to fabricate an FPA device having a common ground structure including a common ground plane layer and a pass-through conduction layer (e.g., an FPA device 1200 as shown in FIG. 12).

Figure 21A:
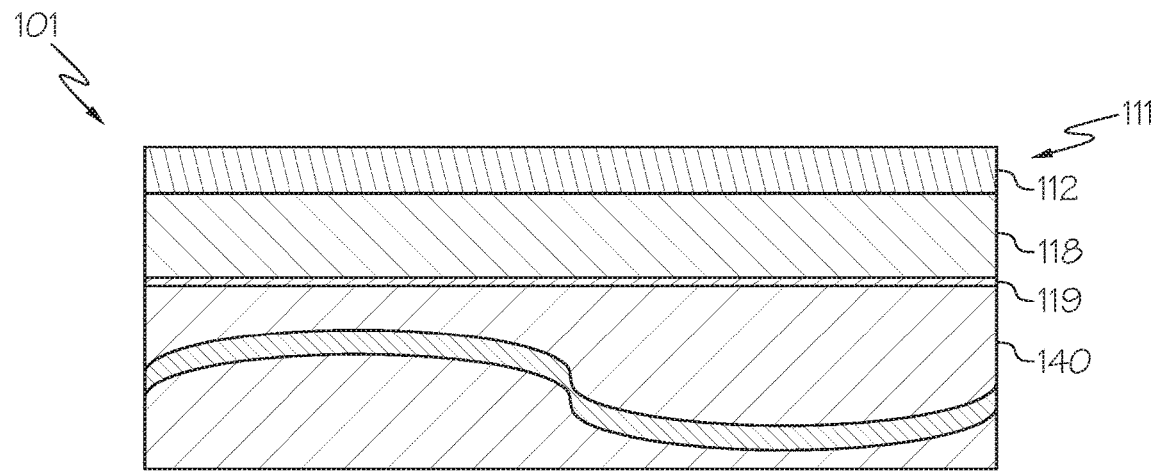
FIGS. 21A-27 are schematic illustrations of processes for fabricating the example FPA device depicted in FIGS. 1 and 2 according to one or more embodiments described and illustrated herein.

As shown in FIG. 21A, a wafer 101 is initially provided. The example wafer 101 includes a bulk substrate layer 140 (e.g., GaSb) on which a contact layer 119 is epitaxially grown. The absorber layer(s) of the detector structure 118 is epitaxially grown on the contact layer 119, and the wide bandgap common ground plane layer 112 defining the common ground structure 111 is epitaxially grown on the absorber layer. The growth of the various layers of the wafer 101 may be performed by any known or yet-to-be-developed processes.

Figure 21B:
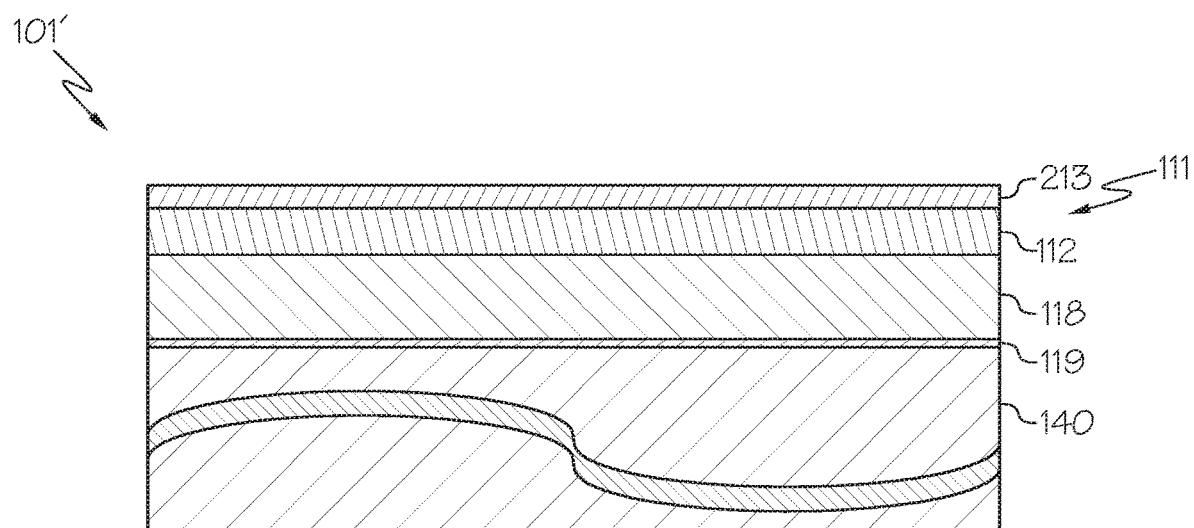

The wafer 101' schematically depicted in FIG. 21B is similar to the wafer of FIG. 21A except a highly doped region in the common ground plane layer 112 to act as a primary conduction region 213 is grown. As discussed above with reference to FIG. 2, the primary conduction region 213 may be provided if the ohmic contact to active pixels should be improved. It is noted that FIGS. 22-26 do not include the primary conduction region 213 for ease of illustration. However, the primary conduction region 213 is shown in FIG. 27. It should be understood that the primary conduction region 213 may or may not be provided in the embodiments described herein.

Figure 22:
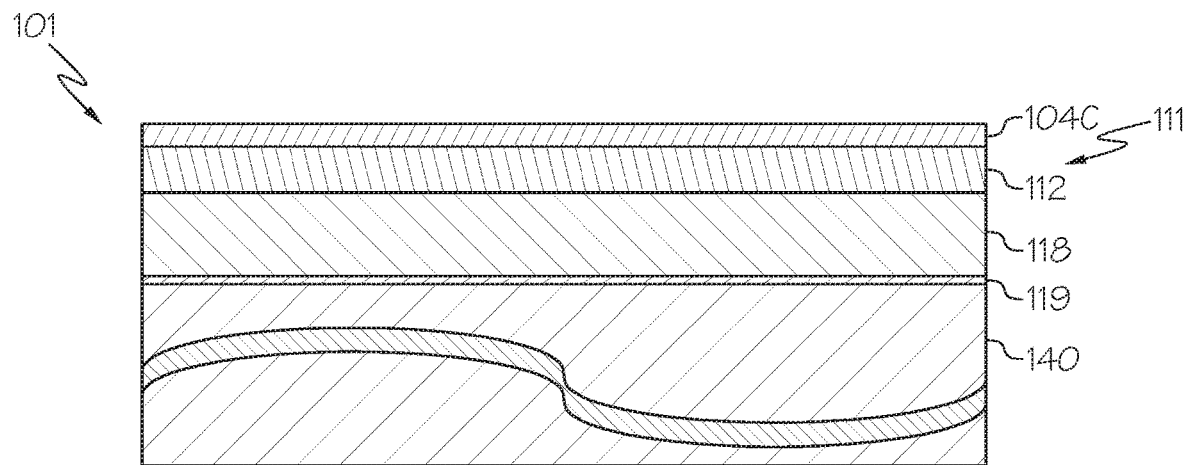

Referring to FIG. 21A or 21B, the top surface of the wafer 101, 101' is first prepared for bonding to a transparent carrier wafer. The transparent carrier wafer provides the optical layer 102 of the resulting FPA device described hereinabove. The surface preparation of the wafer 101, 101' may include polishing and applying optical coatings to improve photon transmission. FIG. 22 depicts an optional optical coating 104C disposed on the common ground plane layer 112. Example optical coatings include, but are not limited to, silicon, silicon monoxide, germanium, zinc sulfide, yttrium fluoride, and other IR transparent materials with suitable optical properties (i.e. refractive index) for specific application requirements.

Figure 23:
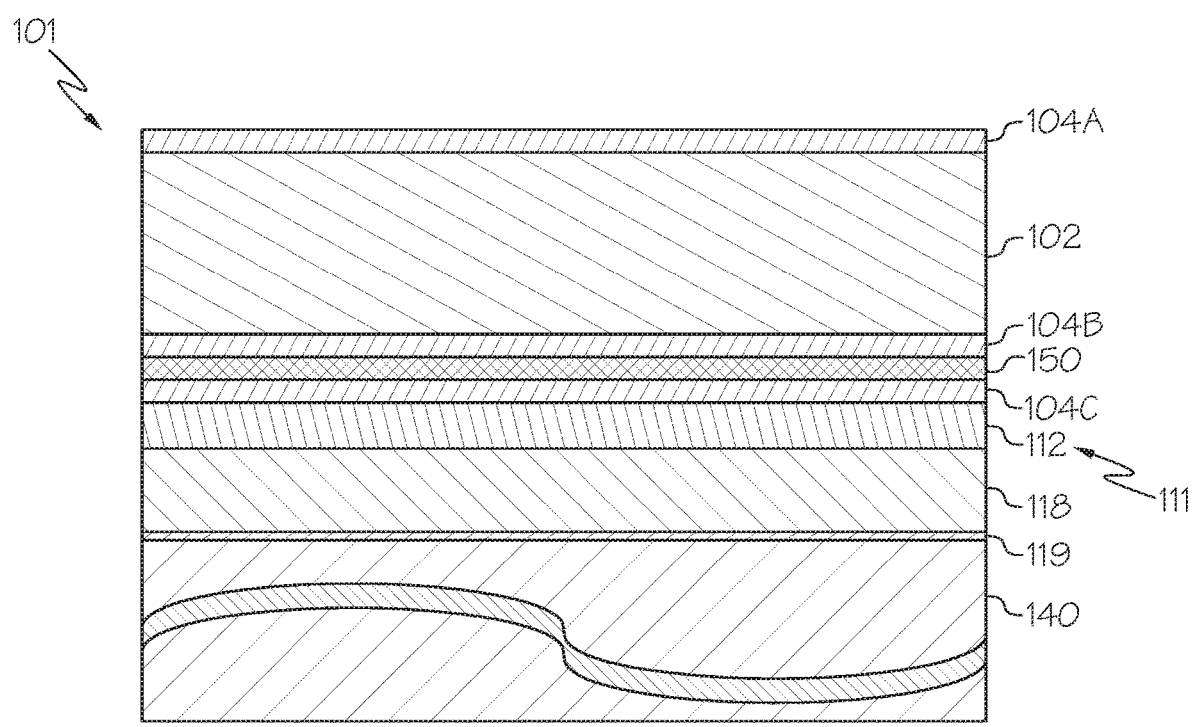

Referring now to FIG. 23, the wafer 101 is bonded to the transparent carrier wafer 102 (also referred to herein as the optical layer 102), which is fabricated from a material that is transmissive to radiation having a wavelength in the predetermined spectral band, such as silicon. The example transparent carrier wafer 102 has optional optical coatings 104A and 104B provided on each surface. It should be understood that embodiments may not utilize optical coatings 104A, 104B, or may have only one surface of the transparent carrier wafer 102 be coated with an optical coating.

The wafer 101 is bonded to the transparent carrier wafer 102 using a thin transparent adhesion layer 150. The adhesion layer 150 may be a very thin epoxy or other material that has negligible absorption of radiation having a wavelength in the predetermined spectral range. It is noted that, if the adhesion layer 150 is thin enough to be substantially non-absorbing (i.e., transparent), the optical coatings 104B, 104C surrounding the adhesion layer 150 may not be needed.

Figure 24:
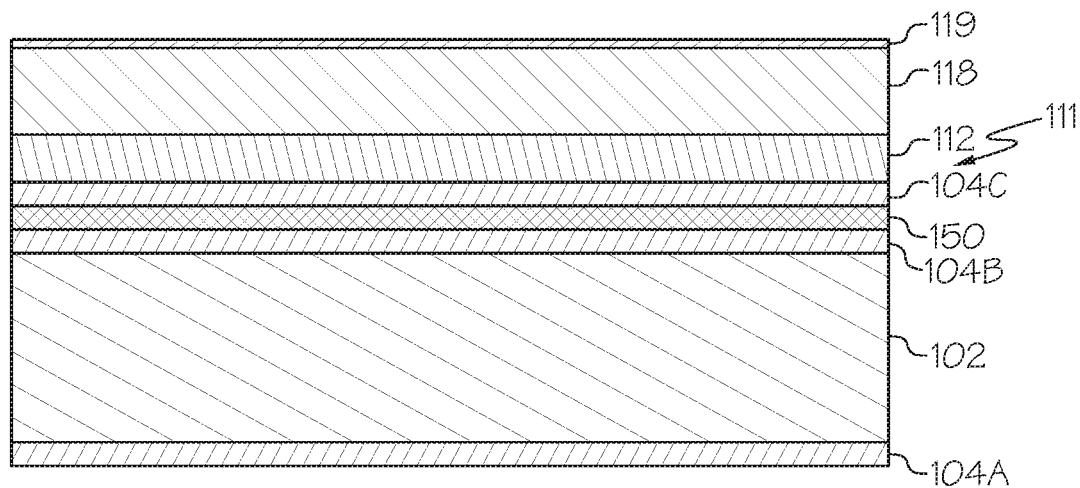

Next, the bulk substrate layer 140 is thinned using a suitable process such as grinding, lathing, fly cutting, and milling, to remove a large portion of the bulk substrate layer 140. The remaining bulk substrate layer 140 may be removed completely using a chemical etch process to prevent damage to the underlying layers. The chemical etch process may be highly selective and result in complete substrate removal without etching into the detector material of the underlying layers. FIG. 24 schematically depicts the assembly with the bulk substrate layer 140 completely removed.

Figure 25:
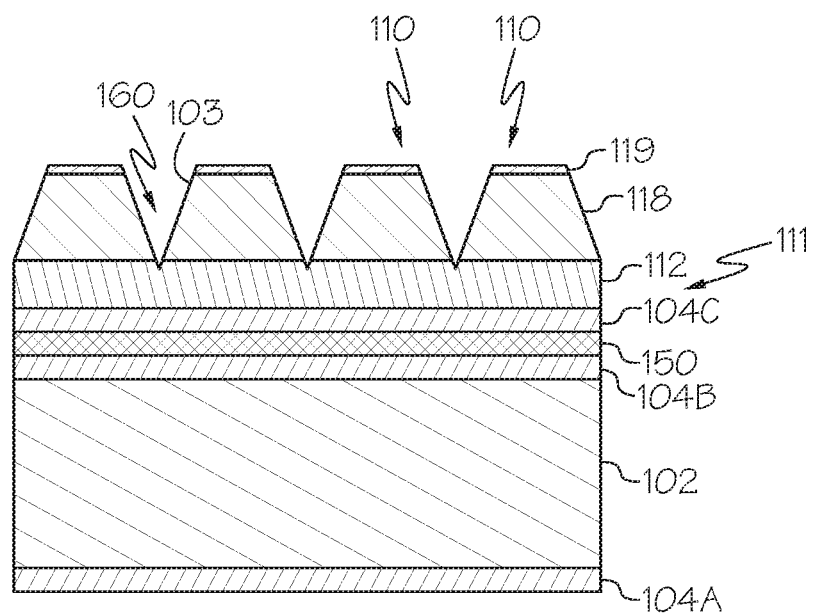

Referring now to FIG. 25, a reticulation etching process is performed to etch trenches 160 into the absorber layer of the detector structure 118 (or absorber layers in dual-band applications). The etching process may include applying a suitably patterned masking material, such as photoresist, and a suitable etching process. As a non-limiting example, the etching process may include a combination of a dry-etch process to produce the desired pixel profile, and a wet-etch process to remove undesired by-produces from the pixel sidewalls 103.

The reticulation etching process should be carried out such that desired device performance parameters are achieved. The trench 160 should penetrate completely through the absorber layer(s) of the detector structure 118 and into the common ground plane layer 112 to minimize spatial cross-talk from photo-generated carriers migrating to an adjacent pixel, and being collected at the wrong pixel location. Additionally, control of the pixel sidewall 103 angle enhances the probability of photon absorption through total internal reflection of photons that are incident on the pixel sidewalls 103. Further, the reticulation etching process should not penetrate completely through the common ground plane layer 112 so that a sufficient amount of material remains to form common contacts between pixels. Following the reticulation etching process, the masking material is removed, or, in some embodiments, may remain on the pixels so long as a suitable contact to the pixels may be formed.

Figure 26:
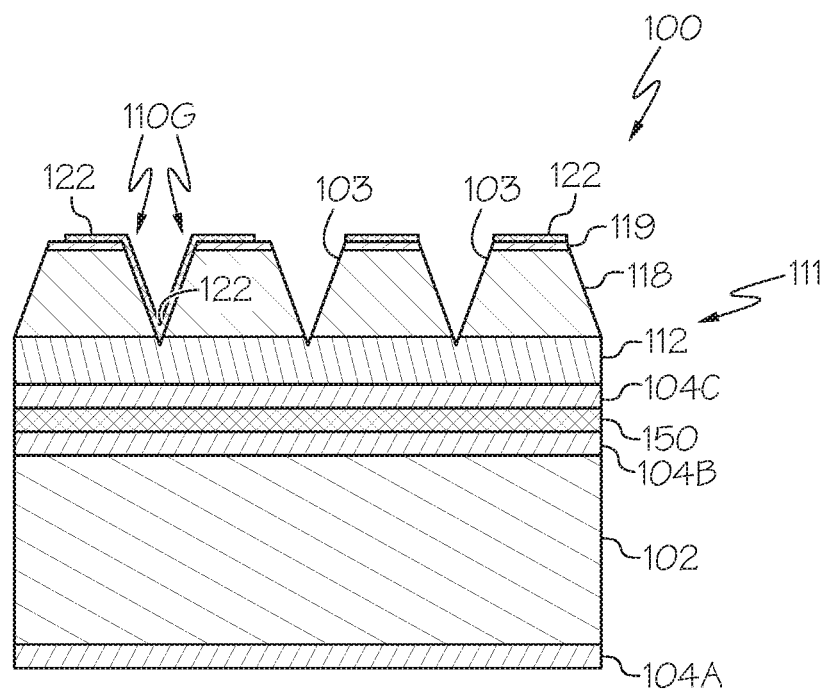
Figure 27:
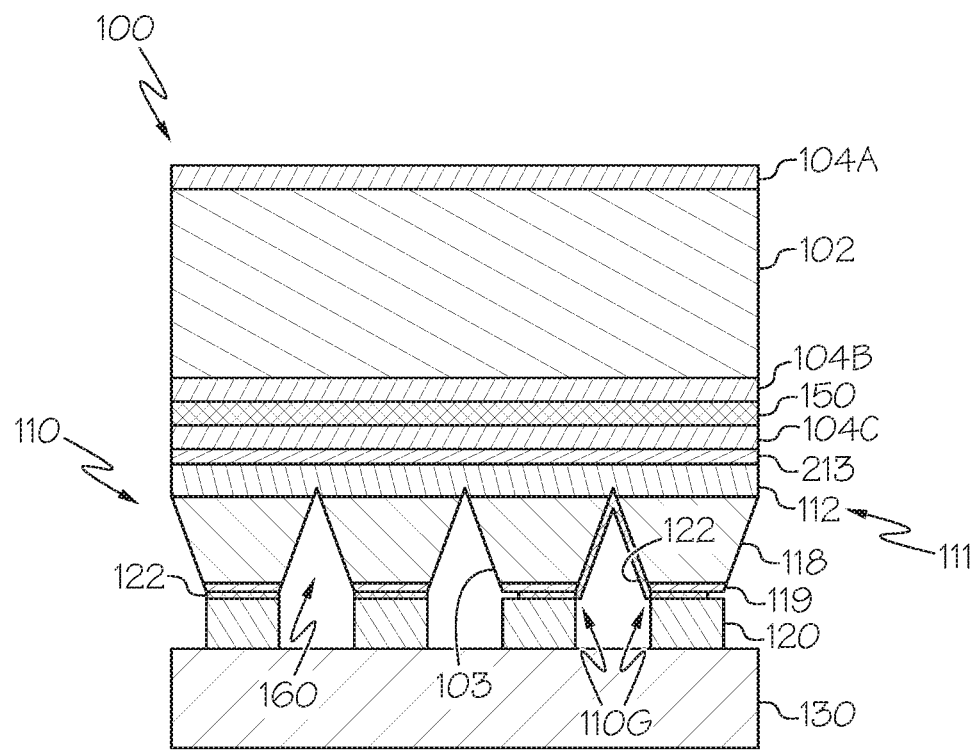

Referring to FIG. 26, contact metallization is performed by applying an electrically conductive layer 122 (e.g., a metal layer) on the contact layer 119 to form electrical contacts on the active pixels 110. Additionally, one or more ground pixels 110G are formed by applying the electrically conductive layer 122 on one or more sidewalls 103 of the one or more ground pixels 110G. Etch processes may be used to clean the surfaces prior to metal application. The electrically conductive layer 122 on the active pixels 110 forms an ohmic contact to the pixel top, or it may also be allowed to partially extend down the side of the active pixels 110, so long as it does not contact the common ground structure 111. The electrically conductive layer 122 on the one or more ground pixels 110G is continuous from the top of the ground pixel 110G to the common ground structure 111 to form an ohmic contact to the common ground structure 111.

Referring to FIG. 27, interconnect structures, such as bonding bumps 120 (e.g., indium bonding bumps) are applied to the electrically conductive layer 122 of the active pixels 110 and the ground pixels 110G. The assembly may be diced into separate individual detector arrays. The interconnect structures/bonding bumps 120 of the individual detector arrays are then bonded to a ROIC assembly 130, thereby interconnecting all of the pixels and forming an FPA device 100 that is ready for insertion into a focal plane assembly. It is noted that epoxy backfill of the FPA device 100 is not required, and that a pixel interconnect insulator may be provided on the ROIC assembly 130, such as the pixel interconnect insulator described in U.S. Pat. No. 7,777,186, which is hereby incorporated by reference in its entirety.

Figure 28:
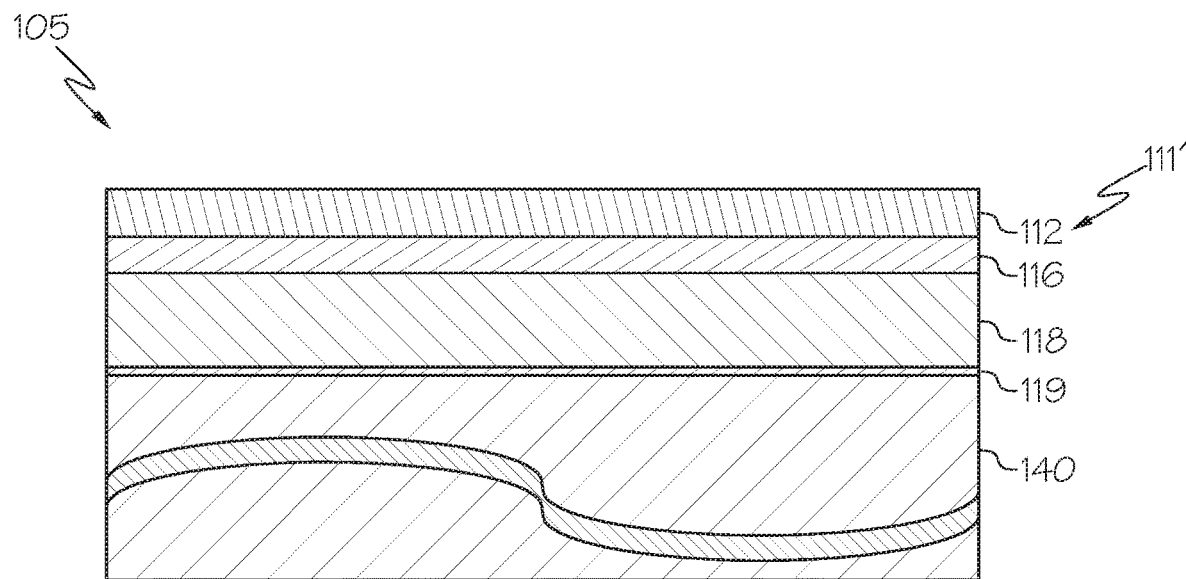
FIGS. 28-34 are schematic illustrations of processes for fabricating the example FPA device depicted in FIG. 12 according to one or more embodiments described and illustrated herein.

Another example of a transparent common ground structure FPA architecture is schematically depicted in FIG. 28. In the illustrated embodiment, a wafer 105 is similar to the wafer 101 depicted in FIG. 21A except that a wider bandgap pass-through conduction layer 116 is disposed between a common ground plane layer 112 and a detector structure 118. The pass-through conduction layer 116 and the common ground plane layer 112 define a common ground structure 111'. The wide bandgap common ground layer 112 serves as an etch stop layer in the pixel reticulation process due to a chemical composition which is slower to etch than the absorber material. However, the material composition of the wide bandgap common ground plane layer 112 can be more difficult to form an ohmic contact with, so the pass-through conduction layer 116 is provided with a narrower bandgap than the wide bandgap common ground plane layer 112. The bandgap of the pass-through conduction layer 116 is still wider than that of the absorber layer(s) of the detector structure 118. Proper design of the pass-through conduction layer 116 ensures that photons can still pass through this layer into the active pixels 110, and that ohmic contact to the ground metal connection may be easily made. As described in more detail below, during reticulation, the absorber layer(s) and the pass-through conduction layer 116 are etched completely through (i.e., fully reticulated), and the trench terminates at or within the common ground plane layer 112.

Figure 29:
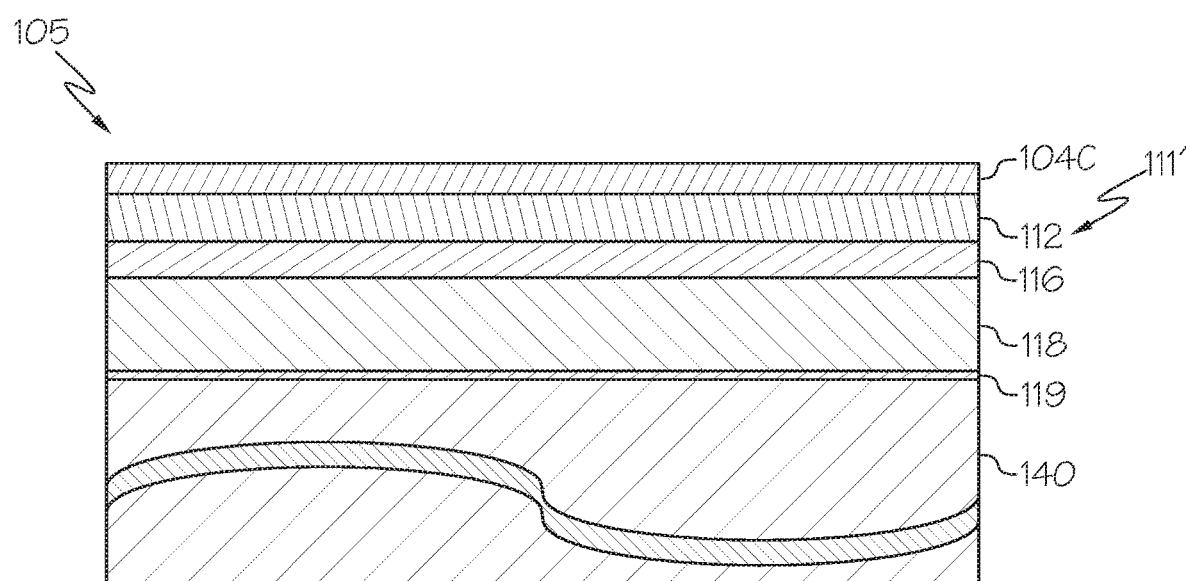

The top surface of the wafer 105 is first prepared for bonding to a transparent carrier wafer. The transparent carrier wafer provides the optical layer 102 of the resulting FPA device described hereinabove. The surface preparation of the wafer 105 may include polishing and applying optical coatings to improve photon transmission. FIG. 29 schematically depicts an optional optical coating 104C disposed on the common ground plane layer 112.

Figure 30:
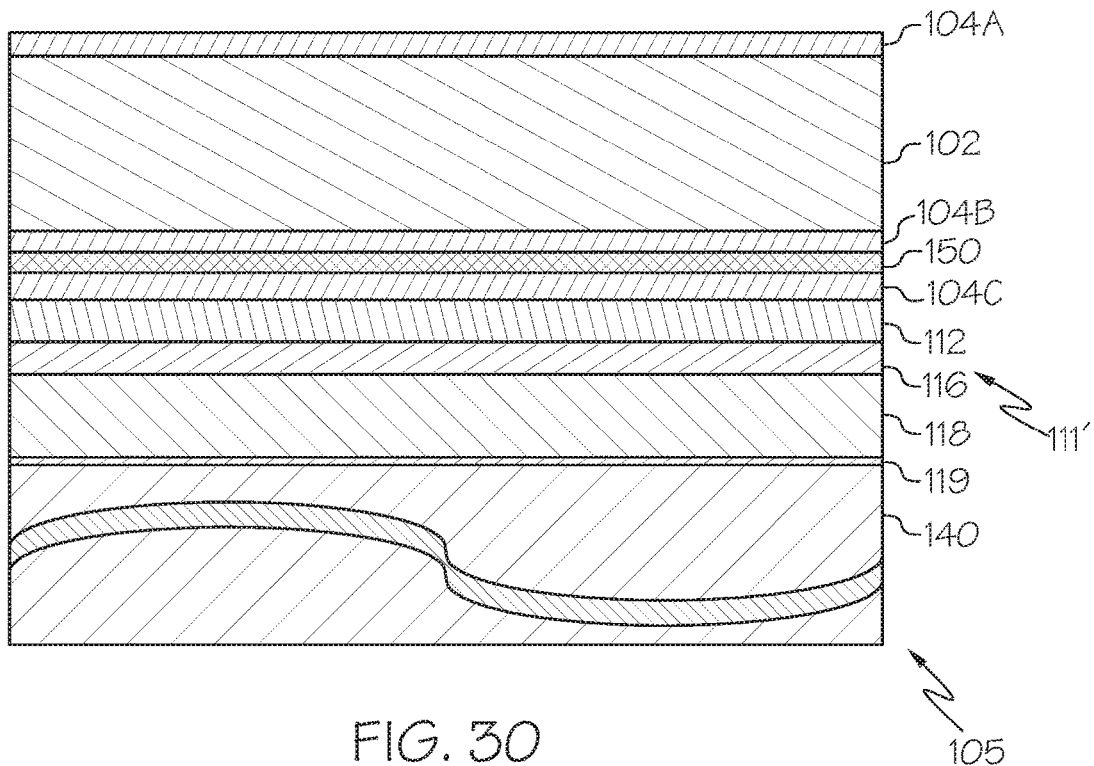

Referring now to FIG. 30, the wafer 105 is bonded to the transparent carrier wafer 102, which is fabricated from a material that is transmissive to radiation having a wavelength in the predetermined spectral band, such as silicon. The example transparent carrier wafer 102 has optional optical coatings 104A and 104B provided on each surface. It should be understood that embodiments may not utilize optical coatings 104A, 104B, or may have only one surface of the transparent carrier wafer 102 be coated with an optical coating.

The wafer 105 is bonded to the transparent carrier wafer 102 using a thin transparent adhesion layer 150. As described above, the adhesion layer 150 may be a very thin epoxy or other material that has negligible absorption of radiation having a wavelength in the predetermined spectral range. It is noted that, if the adhesion layer 150 is thin enough to be substantially non-absorbing (i.e., transparent), the optical coatings 104B, 104C surrounding the adhesion layer 150 may not be needed.

Figure 31:
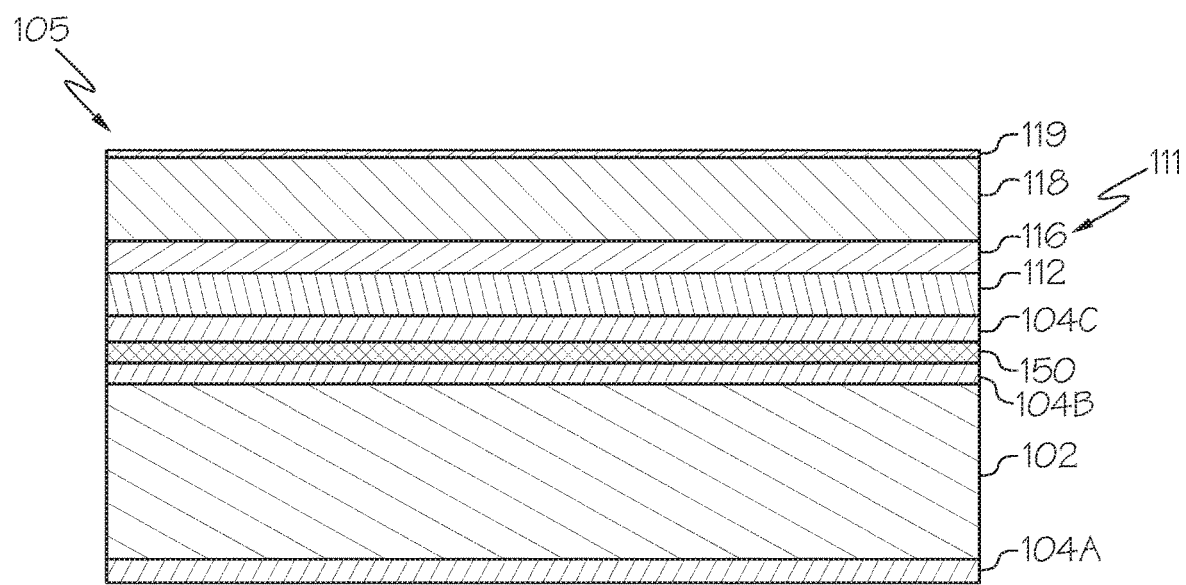

Next, the bulk substrate layer 140 is thinned using a suitable process such as grinding, lathing, fly cutting, and milling, to remove a large portion of the bulk substrate layer 140. The remaining bulk substrate layer 140 may be removed completely using a chemical etch process to prevent damage to the underlying layers. The chemical etch process may be highly selective and result in complete substrate removal without etching into the detector material of the underlying layers. FIG. 31 schematically depicts the assembly with the bulk substrate layer 140 completely removed.

Figure 32:
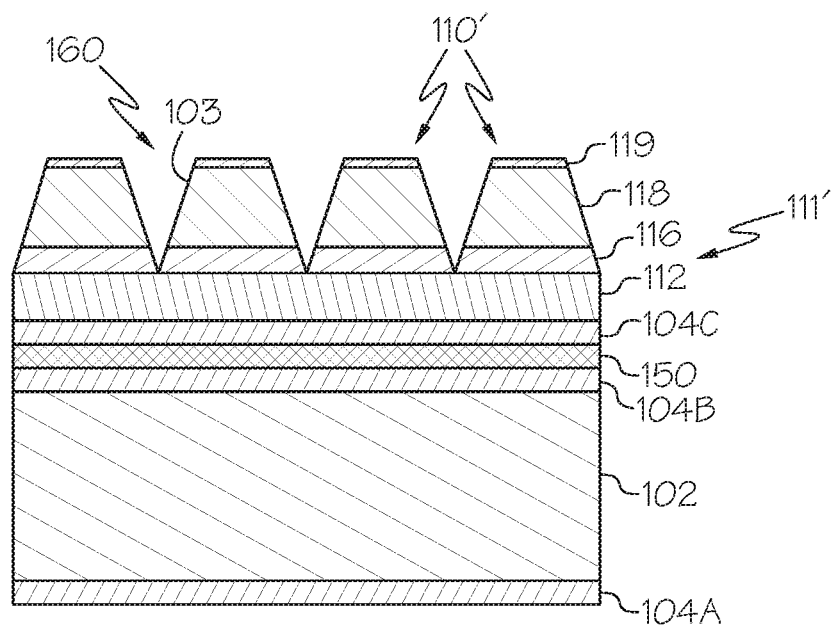

Referring now to FIG. 32, a reticulation etching process is performed to etch trenches 160 into the absorber layer of the detector structure 118 (or absorber layers in dual-band applications) and the pass-through conduction layer 116. The etching process may include applying a suitably patterned masking material, such as photoresist, and a suitable etching process. As a non-limiting example, the etching process may include a combination of a dry-etch process to produce the desired pixel profile, and a wet-etch process to remove undesired by-produces from the pixel sidewalls 103.

The reticulation etching process should be carried out such that desired device performance parameters are achieved. The trench 160 should penetrate completely through the absorber layer(s) of the detector structure 118 and into the common ground plane layer 112 to minimize spatial cross-talk from photo-generated carriers migrating to an adjacent pixel, and being collected at the wrong pixel location. The etching process will slow and stop within the wide bandgap common ground layer 112 due to chemical selectivity differences. Additionally, control of the pixel sidewall 103 angle enhances the probability of photon absorption through total internal reflection of photons that are incident on the sidewalls 103. Further, the reticulation etching process should not penetrate completely through the common ground plane layer 112 so that a sufficient amount of material remains to form common contacts between pixels. Following the reticulation etching process, the masking material is removed, or, in some embodiments, may remain on the pixels so long as a suitable contact to the pixels may be formed.

Figure 33:
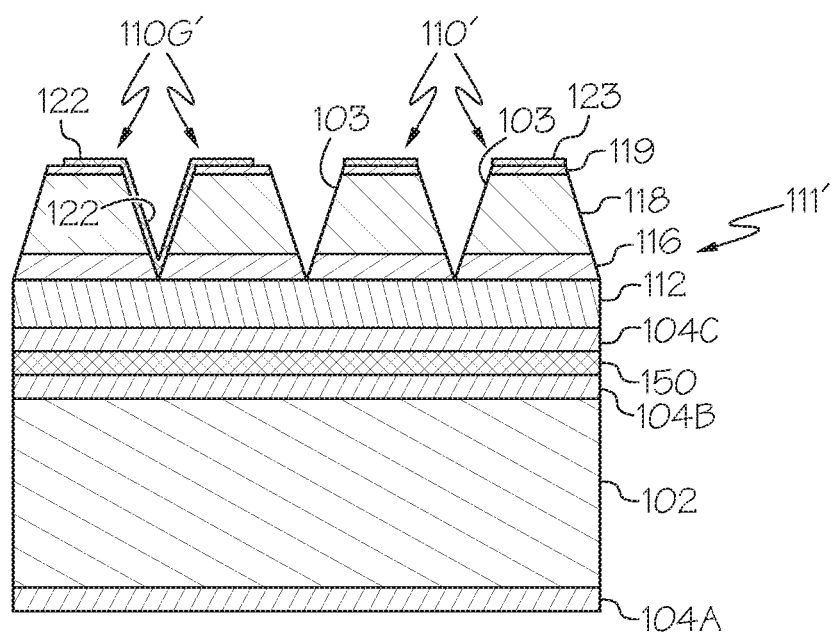

Referring to FIG. 33, contact metallization is performed by applying an electrically conductive layer 122 (e.g., a metal layer) on the contact layer 119 to form electrical contacts on the active pixels 110'. Additionally, one or more ground pixels 110G' are formed by applying the electrically conductive layer 122 on one or more sidewalls 103 of the one or more ground pixels 110G'. Etch processes may be used to clean the surfaces prior to metal application. The electrically conductive layer 122 on the active pixels 110' forms an ohmic contact to the pixel 110' top, or it may also be allowed to partially extend down the side of the active pixels 110', so long as it does not contact the common ground structure 111. The electrically conductive layer 122 on the one or more ground pixels 110G' is continuous from the top of the ground pixel 110G' to the common ground structure 111 to form an ohmic contact to the common ground structure 111. If one metal composition does not provide ohmic contacts to both the active pixels 110' and the ground pixels 110G', the metalization step may be separated into different metal compositions to provide ohmic contacts to both types of contacts.

Figure 34:
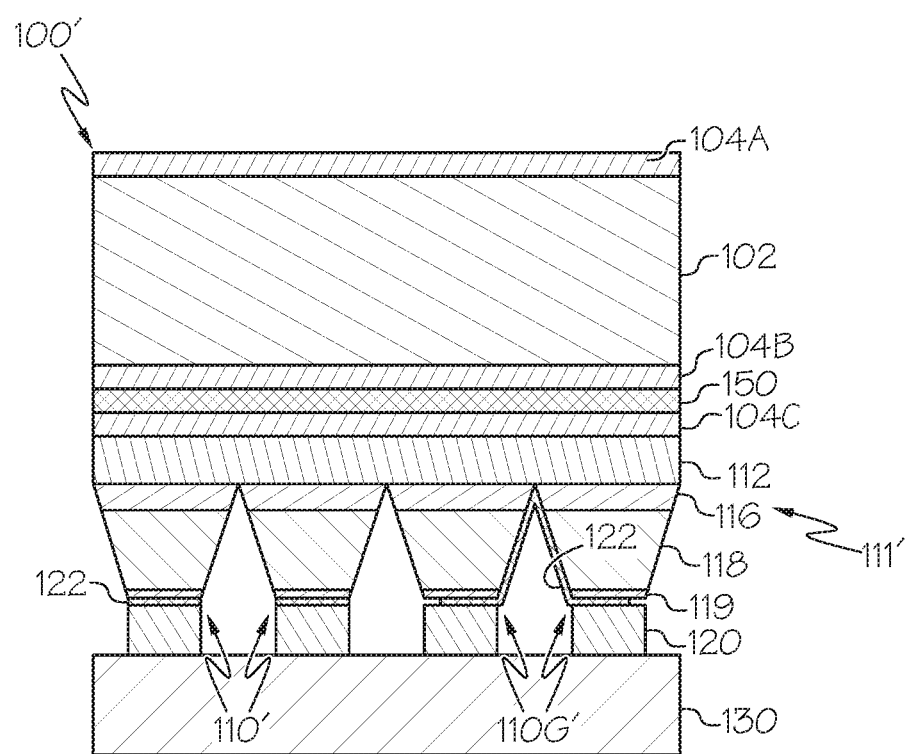

Referring to FIG. 34, interconnect structures, such as bonding bumps 120 (e.g., indium bonding bumps) are applied to the electrically conductive layer 122 of the active pixels 110' and the ground pixels 110G'. The assembly may be diced into separate individual detector arrays. The interconnect structures/bonding bumps 120 of the individual detector arrays are then bonded to a ROIC assembly 130, thereby interconnecting all of the pixels and forming an FPA device 100' that is ready for insertion into a focal plane assembly. It is noted that epoxy backfill of the FPA device 100' is not required, and that a pixel interconnect insulator may be provided on the ROIC assembly 130, such as the pixel interconnect insulator described in U.S. Pat. No. 7,777,186.

The foregoing description of the various embodiments of the present disclosure has been presented for the purposes of illustration and description. Many alternatives, modifications and variations will be apparent to those skilled in the art of the above teaching. Moreover, although multiple aspects have been presented, such aspects need not be utilized in combination, and various combinations of aspects are possible in light of the various embodiments provided above. Accordingly, the above description is intended to embrace all possible alternatives, modifications, combinations, and variations that have been discussed or suggested herein, as well as all others that fall with the principles, spirit and broad scope of the subject matter as defined by the claims.

The invention claimed is:

1. A front-side illuminated infrared detector device comprising:
   a contact layer;
   a detector structure adjacent to the contact layer, wherein the detector structure is capable of absorbing radiation;
   a common ground structure adjacent the detector structure, wherein the entire common ground structure is transmissive to radiation in an infrared spectral band, and the common ground structure has a bandgap that is wider than a bandgap of the detector structure; and
   an optical layer adjacent the common ground structure.

2. The front-side illuminated infrared detector device of claim 1, further comprising a uni-polar barrier layer disposed between the common ground structure and the detector structure.

3. The front-side illuminated infrared detector device of claim 2, wherein the contact layer is a p-doped short-wave infrared layer, and the detector structure comprises an absorber layer having a short-wave to mid-wave chirped region adjacent the uni-polar barrier layer.

4. The front-side illuminated infrared detector device of claim 1, wherein the common ground structure comprises an etch buffer region and a primary conduction region.

5. The front-side illuminated infrared detector device of claim 4, wherein the etch buffer region is unintentionally doped and the primary conduction region is doped.

6. The front-side illuminated infrared detector device of claim 1, wherein the common ground structure comprises:
   a common ground plane layer;
   a carrier collector layer adjacent the common ground plane layer; and
   uni-polar barrier layer disposed between the carrier collector layer and the detector structure.

7. The front-side illuminated infrared detector device of claim 6, wherein the carrier collector layer has a bandgap that is narrower than the bandgap of the detector structure.

8. The front-side illuminated infrared detector device of claim 6, wherein the carrier collector layer has alternating layers of a wider bandgap material and a narrower bandgap material such that a bandgap of the carrier collector layer has a corrugated shape.

9. The front-side illuminated infrared detector device of claim 1, wherein:
   the common ground structure comprises a common ground plane layer and a pass-through conduction layer disposed between the detector structure and the common ground plane layer; and
   the common ground plane layer comprises aluminum.

10. The front-side illuminated infrared detector device of claim 9, further comprising an oxidation prevention layer disposed between the common ground plane layer and the optical layer.

11. The front-side illuminated infrared detector device of claim 9, wherein the common ground structure further comprises a uni-polar barrier layer disposed between the pass-through conduction layer and the detector structure.

12. The front-side illuminated infrared detector device of claim 9, wherein the detector structure comprises a first absorber layer having a first bandgap and a second absorber layer having a second bandgap.

13. The front-side illuminated infrared detector device of claim 12, further comprising a uni-polar barrier layer disposed between the first absorber layer and the second absorber layer.

14. The front-side illuminated infrared detector device of claim 1, wherein the detector structure comprises:
   a first absorber layer having a first bandgap;
   a second absorber layer having a second bandgap; and
   a uni-polar layer disposed between the first absorber layer and the second absorber layer.

15. The front-side illuminated infrared detector device of claim 14, wherein the common ground structure comprises a common ground plane layer comprising aluminum.

16. A focal plane array comprising:
   an array of pixels, each pixel comprising an infrared detector device further comprising:

a contact layer;

a detector structure adjacent to the contact layer, wherein the detector structure is capable of absorbing radiation;

a common ground structure adjacent the detector structure, wherein:

the entire common ground structure is transmissive to radiation in an infrared spectral band;

the common ground structure has a bandgap that is wider than a bandgap of the detector structure; and the contact layer and the detector structure are fully reticulated, and the common ground structure provides a common ground for the array of pixels; and an optical layer adjacent the common ground structure.

17. The focal plane array of claim 16, wherein the array of pixels comprises at least one ground pixel.

18. The focal plane array of claim 17, wherein the at least ground pixel comprises an electrically conductive layer disposed on a wall of the at least one ground pixel that electrically couples the contact layer of the at least one ground pixel to the common ground structure.

19. The focal plane array of claim 16, wherein each pixel further comprises a uni-polar barrier layer disposed between the common ground structure and the detector structure, and the uni-polar barrier layer is fully reticulated.

20. The focal plane array of claim 19, wherein the contact layer is a p-doped short-wave infrared layer, and the detector structure comprises an absorber layer having a short-wave to mid-wave chirped region adjacent the uni-polar barrier layer.

21. The focal plane array of claim 16, wherein the common ground structure comprises an etch buffer region and a primary conduction region.

22. The focal plane array of claim 21, wherein the etch buffer region is partially reticulated and the primary conduction region is not reticulated.

23. The focal plane array of claim 21, wherein the etch buffer region is unintentionally doped and the primary conduction region is doped.

24. The focal plane array of claim 16, wherein the common ground structure comprises:

a common ground plane layer;

a carrier collector layer adjacent the common ground plane layer; and uni-polar barrier layer disposed between the carrier collector layer and the detector structure.

25. The focal plane array of claim 24, wherein:

the uni-polar barrier layer is fully reticulated;

the carrier collector layer is at least partially reticulated; and the common ground plane layer is not reticulated.

26. The focal plane array of claim 24, wherein:

the uni-polar barrier layer is fully reticulated;

the carrier collector layer is fully reticulated; and the common ground plane layer is partially reticulated.

27. The focal plane array of claim 24, wherein:

the array of pixels comprises at least one ground pixel comprising an electrically conductive layer disposed on a wall of the at least one ground pixel that electrically couples the contact layer of the at least one ground pixel to the common ground structure;

the uni-polar barrier layer of the at least one ground pixel is fully reticulated;

the carrier collector layer is partially reticulated; and the uni-polar barrier layer and the carrier collector layer of active pixels of the array of pixels are not reticulated.

28. The focal plane array of claim 27, wherein the carrier collector layer has a bandgap that is narrower than the bandgap of the detector structure.

29. The focal plane array of claim 27, wherein the carrier collector layer has alternating layers of a wider bandgap material and a narrower bandgap material such that a bandgap of the carrier collector layer has a corrugated shape.

30. The focal plane array of claim 16, wherein:

the common ground structure comprises a common ground plane layer and a pass-through conduction layer disposed between the detector structure and the common ground plane layer;

the pass-through conduction layer is fully reticulated; and the common ground plane layer comprises aluminum.

31. The focal plane array of claim 30, further comprising an oxidation prevention layer disposed between the common ground plane layer and the optical layer.

32. The focal plane array of claim 30, wherein the common ground structure further comprises a uni-polar barrier layer disposed between the pass-through conduction layer and the detector structure.

33. The focal plane array of claim 30, wherein the detector structure comprises a first absorber layer having a first bandgap and a second absorber layer having a second bandgap.

34. The focal plane array of claim 33, further comprising a uni-polar barrier layer disposed between the first absorber layer and the second absorber layer.

35. The focal plane array of claim 16, wherein the detector structure comprises:

a first absorber layer having a first bandgap;

a second absorber layer having a second bandgap; and a uni-polar layer disposed between the first absorber layer and the second absorber layer.

36. The focal plane array of claim 35, wherein the common ground structure comprises a common ground plane layer comprising aluminum.

* * * * *